United States Patent
Grimes et al.

(10) Patent No.: US 9,394,623 B2
(45) Date of Patent: *Jul. 19, 2016

(54) METHOD TO FABRICATE VERTICALLY ORIENTED ANATASE NANOWIRES ON A SUBSTRATE

(71) Applicants: Craig Grimes, Raleigh, NC (US); Thomas Latempa, Philadelphia, PA (US); Kevin Kreisler, Hackensack, NJ (US)

(72) Inventors: Craig Grimes, Raleigh, NC (US); Thomas Latempa, Philadelphia, PA (US); Kevin Kreisler, Hackensack, NJ (US)

(*) Notice: Subject to any disclaimer, the term of this patent is extended or adjusted under 35 U.S.C. 154(b) by 0 days.

This patent is subject to a terminal disclaimer.

(21) Appl. No.: 14/215,722

(22) Filed: Mar. 17, 2014

(65) Prior Publication Data

US 2014/0196658 A1    Jul. 17, 2014

Related U.S. Application Data

(63) Continuation of application No. 13/590,786, filed on Aug. 21, 2012, now Pat. No. 8,835,285.

(60) Provisional application No. 61/792,783, filed on Mar. 15, 2013.

(51) Int. Cl.

| | | |
|---|---|---|
| H01L 29/06 | (2006.01) |
| H01L 29/12 | (2006.01) |
| C30B 1/10 | (2006.01) |
| C30B 7/10 | (2006.01) |
| C30B 29/34 | (2006.01) |
| B01J 37/02 | (2006.01) |
| B01J 37/03 | (2006.01) |
| B01J 37/06 | (2006.01) |
| B01J 37/34 | (2006.01) |
| B01J 21/06 | (2006.01) |
| B01J 35/00 | (2006.01) |
| B01J 35/06 | (2006.01) |
| C30B 1/02 | (2006.01) |
| B82Y 10/00 | (2011.01) |
| C30B 29/60 | (2006.01) |
| H01G 9/20 | (2006.01) |

(52) U.S. Cl.
CPC ............. *C30B 1/10* (2013.01); *B01J 21/063* (2013.01); *B01J 35/002* (2013.01); *B01J 35/004* (2013.01); *B01J 35/06* (2013.01); *B01J 37/0228* (2013.01); *B01J 37/033* (2013.01); *B01J 37/06* (2013.01); *B01J 37/346* (2013.01); *B01J 37/348* (2013.01); *B82Y 10/00* (2013.01); *C30B 1/02* (2013.01); *C30B 7/10* (2013.01); *C30B 29/34* (2013.01); *C30B 29/602* (2013.01); *H01L 29/0665* (2013.01); *H01G 9/2031* (2013.01); *H01L 29/0676* (2013.01); *H01L 29/127* (2013.01)

(58) Field of Classification Search
None
See application file for complete search history.

(56) References Cited

U.S. PATENT DOCUMENTS 8,835,285 B2 *  9/2014  Grimes et al. ............... 438/478

* cited by examiner

*Primary Examiner* — Asok K Sarkar
(74) *Attorney, Agent, or Firm* — Porzio, Bromberg & Newman, P.C.

(57) ABSTRACT

The present invention relates to fabrication and application of compositions, devices, methods and systems for utilizing radiation more efficiently as compared to known systems. A synthesis method provides deposition of titania on a substrate without the use of an electrochemical reaction. An integrated architecture formed by the method of the present invention is comprised of vertically-oriented, one-dimensional, monocrystalline, n-type anatase nanowires in communication with a common transparent conductive substrate, and which are intercalated with a consortia of p-type quantum dots tuned for absorption of infrared and other radiation.

22 Claims, 1 Drawing Sheet

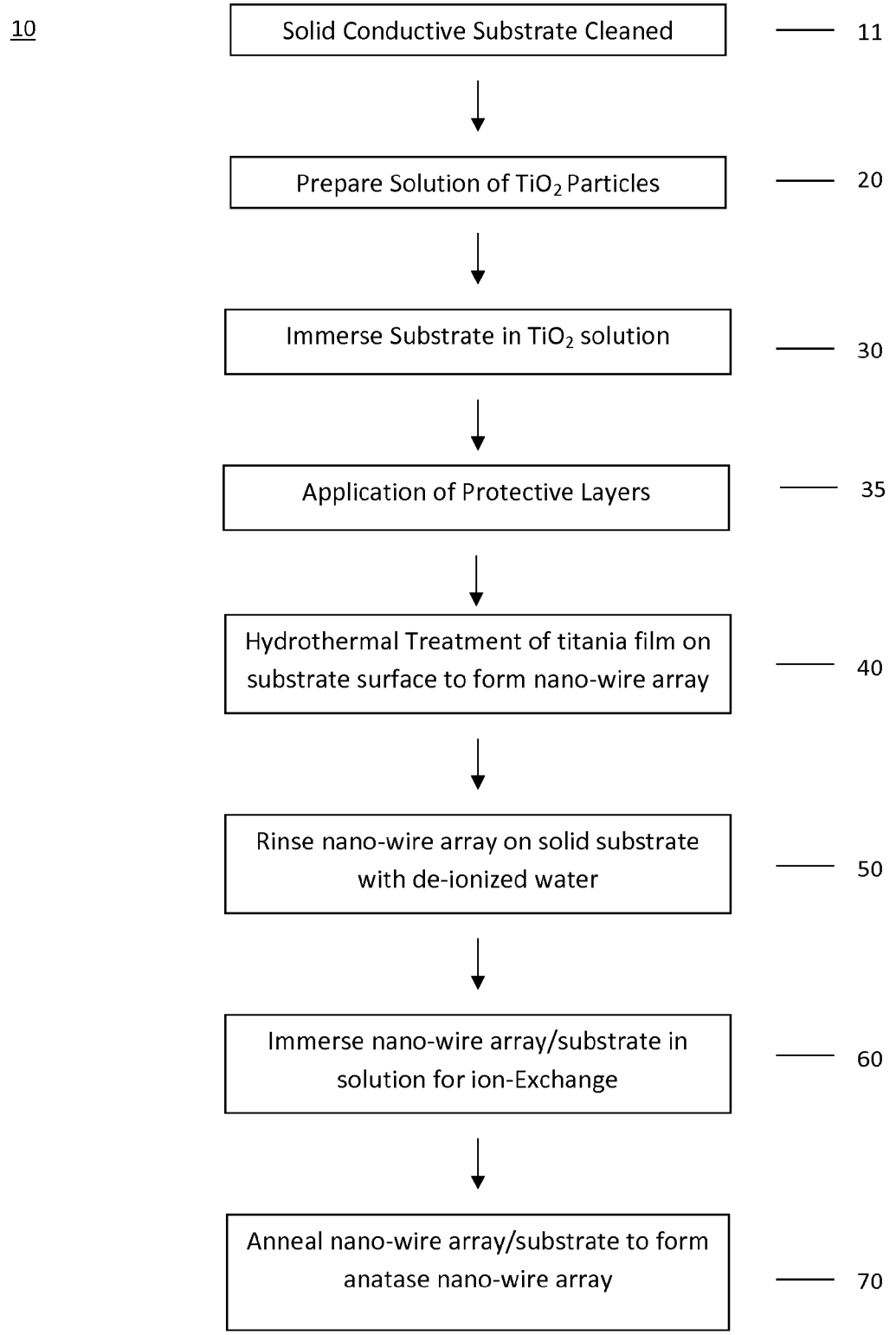

METHOD TO FABRICATE VERTICALLY ORIENTED ANATASE NANOWIRES ON A SUBSTRATE

CROSS REFERENCE TO RELATED APPLICATION

This application is a continuation in part of U.S. patent application Ser. No. 13/590,786 and claims the benefit of U.S. Provisional Patent Application No. 61/792,783, filed Mar. 15, 2013, the entirety of each of the applications is hereby incorporated by reference into this application.

BACKGROUND OF THE INVENTION

1. Field of the Invention

The present invention relates to renewable energy production, as well as devices, methods, compositions, systems and other means for manufacturing and using an integrated architecture for charge production from radiation and thermal energy.

2. Description of Related Art

Heat is considered to be a form of waste in a vast array of devices and processes in myriad industries and applications (e.g., transportation, heat and power production, manufacturing and electronics). Microprocessors, for example, generate heat as they consume electrical energy to perform their intended functions. Such devices are designed at great effort and expense to dissipate heat because too much of it diminishes the function of the microprocessor and its related components. In another example, a passenger car uses only about a third of the stored chemical energy in gasoline for power. The balance of the energy released during combustion must be dissipated as waste heat to avoid catastrophic component failure.

There are many known methods and devices that recover heat by conductive, convective and/or radiative means. Nevertheless, about 60% of all of the energy consumed in the U.S. is dissipated to the environment in the form of waste heat. 90% of that energy is released at low grade temperatures (less than 470 K) that are insufficient for most known heat recovery technologies to operate cost-effectively. Such low temperature resources are generally insufficient to justify the capital and other requirements of conventional recovery methods; dissipation into the environment has simply been more cost-effective.

Heat presents further challenges in photovoltaic (PV) and thermophotovoltaic (TPV) devices which convert radiation to electricity, and in photocatalytic (PC), photoelectrochemical (PEC), and thermophotocatalytic (TPC) devices which convert radiation to charge carriers that facilitate chemical reactions. All such known devices and methods are most notably limited by material composition, geometry and other factors which frustrate charge separation and transport and permit significant electron-hole pair recombination to occur. Unless rapidly separated and transported from the cell, photogenerated charges recombine and contribute to thermalization and, in the case of low band gap semiconductors, photocorrosion. Increasing the thermal energy of the system further reduces overall photoconversion efficiency (PCE) by lowering charge mobility and promoting additional recombination; and, photocorrosion has historically impeded development of infrared photovoltaics since the low band gap semiconductors required for such applications are susceptible to oxidation and/or reduction by electron-hole pairs following recombination for the want of rapid separation and transport.

Attempts have been made to decrease these losses, such as by use of dopants, dyes, quantum dots and other substances, structures and device designs that shift the bandgap energy of solar cells; and, in the case of TPV devices, through the use of separate structures to absorb, reemit, reflect and/or filter radiation and thermal energy. However, such attempts have not to date achieved commercial success. For example, high material purity is necessary to achieve sufficient mobilities to avoid recombination while crossing the considerable distances (e.g., upwards of several hundred microns) required for effective absorption in crystalline silicon devices. Fabrication of cells of such purity requires significant cost. In another example, while it is known that quantum dots can be used to absorb infrared photons, the resulting photogenerated charges have very short lifetimes (e.g., femtoseconds)—timescales far too short for such methods to be effective using devices incorporating known charge separation and transport techniques.

Moreover, thermalization is inevitable in such applications notwithstanding the relative speed and degree of separation and transport. In response to AM 1.5G solar radiation, crystalline silicon cells with a 1.1 eV absorption edge are able to absorb photons representing approximately 77% of the solar spectrum (with wavelengths ranging from about 350 nm to about 1.1 μm); the remainder (with wavelengths ranging from about 1.1 μm to 1 mm) heats the cell and its surrounding structures and environment. Further, almost all of the photons in the flux absorbed by the cell have energies greater than the bandgap energy of silicon, and produce both an electron-hole pair and thermalization losses upon absorption. Multiple exciton generation (MEG) methods have been demonstrated in laboratory settings which offer the potential of preventing at least some thermalization by converting surplus (above band gap) energy into additional charge. However, while single excitons produced upon absorption of visible radiation have lifetimes on the order of hundreds of nanoseconds to microseconds, multi-excitons decay much more rapidly and typically recombine within picoseconds—much too fast for MEG to be effective using devices incorporating known methods for charge separation and transport.

In total, more than about two thirds of the solar flux striking a conventional PV device is converted to thermal energy. That energy will eventually dissipate as the system and its surroundings achieve thermal equilibrium. However, the rate and degree to which the resulting dissipation occurs is in part a function of the ambient temperature in the local environment, which is itself directly and indirectly heated by the vast majority of the incoming solar flux that never comes in contact with the surface of the cell. Most of that energy is absorbed and stored by the environment (e.g., air, water, land, buildings, PV housings, and so on) in the form of thermal energy which is then released at low grade temperatures by convection, conduction and, importantly, emission of infrared radiation—in every direction, day and night, 24 hours a day, and 365 days per year. Humanity then adds to those emissions by engaging in activities that create waste heat, which is likewise discharged by convection, conduction and radiation. Conventional attempts to access and convert such emissions into electricity have been limited and unsuccessful.

Materials with temperatures above absolute zero emit radiation with a characteristic frequency distribution that is dependent upon the temperature of the emitter. The flux density, or radiant intensity (energy radiated per unit time, or power, per unit of area, W/m2), I(T), of the emitter is given by the product of the emissivity ($\epsilon$) of the emitter (a real number between 0 and 1), the Stefan-Boltzman constant ($\sigma=5.67\times 10^{-8}$ W m−2 K−4), and the fourth power of the temperature (T) of the emitter in degrees Kelvin (I(T)=∈σT4). The thermal emission spectrum of the emitter is then described using Planck's law of black body radiation, which is a function of the speed of light (c), Planck's constant (h=6.626×10-34 Js, or 4.14×10-15 eVs), Boltzmann's constant (k=1.381×10-23 J K−1), wavelength (λ), and temperature (T) in degrees Kelvin (R(λ)=(2πc2h/λ5)(1/ehc/λkT−1)). Integration of the Planck equation over the wavelength range yields the radiant intensity I(T). The wavelength at which the maximum irradiance occurs is inversely proportional to the temperature, and is given by the Wien displacement law (λmaximum (μm)=2,897.8/T).

The radiant intensity of a material at room temperature (300 K) is approximately 500 W/m2 or 0.05 W/cm2 and the maximum emission occurs at approximately 10 μm. These emissions fall exclusively within the infrared spectrum: none have wavelengths ranging from 0.75 to 1.4 μm (near-infrared, or NIR) or from 1.4 to 3.0 μm (short-wavelength infrared, or SWIR); 22.5% ranges from 3.0 to 9.0 μm (mid-wavelength infrared, or MWIR); 38.9% is between 9.0 and 15.0 μm (long-wavelength infrared, or LWIR); 21.3% is between 15 μm and 20 μm (far infrared, or FIR); and the remaining 17% is between 20 μm and 1 mm (also FIR). No known commercial system exists for the conversion of such low grade emissions.

Current thermophotovoltaic (TPV) systems are fundamentally limited by inadequate separation and transport capabilities. Such systems attempt to avoid recombination and photocorrosion by harvesting a relatively narrow range of IR radiation (typically NIR) emissions from an intense (high temperature) proximate source of radiation. It is common for such systems to first use the source to heat an emitter (e.g., a tungsten plate) with emissivity characteristics which in turn limits the incoming flux to wavelengths that the cell can more readily convert (e.g., NIR radiation using a GaSb cell with a 0.75 eV band gap). The spectral radiancy can be further restricted by placing a pass band filter between the emitter and the cell to reflect all but the desired wavelengths away from the cell. Despite these protections, the radiation incident upon the cell that is not converted to electricity heats the device, which reduces the charge carrier mobility and PCE of the semiconductor (currently available TPV systems do not directly convert thermal energy into electricity, such as in the case of thermoelectric devices). As a result, known TPV devices are limited to NIR systems designed to operate from about 1,300 to 2,000 K.

Fabrication methods for vertically oriented anatase nanowire arrays on transparent conductive substances have been described in US Patent Publication No. 2013/0048947 ('947), which is in its entirety incorporated by reference herein, teaching synthesis of an architecture for use in PV, PC and other applications: vertically-oriented, one-dimensional (1-D), mono- or polycrystalline, anatase $TiO_2$ nanowires in communication with a common transparent substrate or transparent conducting oxide (TCO) coated substrate; and which are intercalated with p-type semiconductors (e.g., quantum dots) such that separation occurs orthogonally over the nanometer-scale distance at each p-n junction following absorption along the micron-scale length of the nanowires.

The '947 application describes the means to simultaneously orthogonalize light absorption and charge separation while rapidly transporting photogenerated charge. Since there is no perfect light absorber, absorption is more fully achieved with thicker layers of light absorbing material. However, thicker layers generally result in slower or less efficient charge separation that in turn leads to unwanted charge recombination. This tradeoff between light absorption and efficient charge transfer has, for example, limited the nanoparticle-based photoanode thickness of modern liquid-based dye sensitized Grätzel solar cells (DSSC) designs to approximately ten microns; although a thicker photoanode layer enables greater light absorption, any benefit obtained with increased light absorption is offset by increased recombination of the photogenerated charges. In contrast, by orthogonalizing absorption and charge separation with structures that also facilitate rapid charge transport (e.g., to underlying electrical contacts), separation occurs over comparatively much smaller distances (i.e., on the order of nanometers versus microns) and absorption can be increased without incurring the sort of recombination penalties that plague known devices. It is desirable to provide for additional or alternative synthesis techniques, as well as further aspect compositions, structures, shapes and orientations resulting in integrated architectures which facilitate conversion of radiation and thermal energy into electrical and other forms of energy.

A need exists for compositions, devices, methods and systems which separate and transport photogenerated charges at rates which minimize or prevent recombination, thermalization and other losses while enabling multiple exciton, broad spectrum and thermal energy conversion.

SUMMARY OF THE INVENTION

The present invention relates to fabrication and application of compositions, devices, methods and systems for utilizing radiation more efficiently as compared to known systems. A synthesis method provides deposition of titania on a substrate without the use of an electrochemical reaction. Preferred embodiments include an integrated architecture formed by the method of the present invention which is comprised of vertically-oriented, one-dimensional, monocrystalline, n-type anatase nanowires in communication with a common transparent conductive substrate, and which are intercalated with a consortia of p-type quantum dots tuned for absorption of infrared and other radiation. In such an architecture, the compositions and sizes of the quantum dots and nanowires can enable broad spectrum absorption and charge production, including by multiple exciton generation; and, the composition, structure, shape and orientation of the nanowires enable rapid charge separation and transport, thereby minimizing recombination and the associated losses. Further, thermal energy absorbed by such an architecture can result in emissions within the high surface area basal plane of the nanowires (e.g., from nanowire to nanowire) for absorption and further charge production by the architecture. In this manner, thermalization can be reduced in comparison to known devices by producing and rapidly extracting more charge; and, thermal energy including from one or more sources external to the architecture, becomes a potent source of additional charge production.

In various embodiments, the architecture can be used for charge production, separation and transport; or for absorption, storage, release, conversion and recovery of thermal energy; or to achieve each of the foregoing objectives in a single integrated architecture for charge production simultaneously from radiation and thermal energy. Fabrication methods and compositions for the inventive architectures are disclosed, as well as systems, methods and devices for the use of such architectures.

The invention will be more fully described by reference to the following drawings.

BRIEF DESCRIPTION OF THE DRAWINGS

FIG. 1 is a flowchart of anatase nanowire array fabrication process in accordance with the teachings of the present invention.

DETAILED DESCRIPTION

Reference will now be made in greater detail to a preferred embodiment of the invention, an example of which is illustrated in the accompanying drawings. Wherever possible, the same reference numerals will be used throughout the drawings and the description to refer to the same or like parts.

In the following description, numerous details are set forth to provide a more thorough explanation of embodiments of the present invention. It will be apparent, however, to one skilled in the art, that embodiments of the present invention may be practiced without these specific details. In other instances, well-known structures and devices are shown in block diagram form, rather than in detail, in order to avoid obscuring embodiments of the present invention. Reference in the specification to "one embodiment" or "an embodiment" means that a particular feature, structure, or characteristic described in connection with the embodiment is included in at least one embodiment of the invention. The appearances of the phrase "in one embodiment" in various places in the specification do not necessarily all refer to the same embodiment.

The invention can relate to charge production architectures, such as architectures that can produce charge from radiation, thermal energy, or both; architectures that can have integral thermal energy management capabilities; architectures that can separate and transport charges at rates which minimize or prevent recombination, thermalization or other losses; architectures that can achieve multiple exciton, broad spectrum or thermal energy conversion; and, architectures that can achieve each of the foregoing objectives in a single integrated platform for charge production from radiation and thermal energy.

In accordance with a first embodiment of the invention, one or more aspects of the architecture are selected, designed and/or modified for its or their charge production, separation and transport properties, or charge attributes as used herein. Such aspects can be alternatively or additionally selected, designed and/or modified for its or their thermal energy production, absorption, storage and/or release capabilities, or their thermal attributes as described herein; for example, to increase or decrease thermal conductivity or emissivity to alter the rate or means at or by which thermal energy is released from an aspect (e.g., more radiation and less conduction, or more or less conduction at a particular location, or more or less radiation in or from a particular direction).

In another embodiment of the invention, an architecture is comprised of one or more extraction layers comprised at least in part of one or more discrete structures which facilitate function of the architecture; activity layers comprised at least in part of one or more agents, at least one of which is in communication with the structures of the extraction layer; and substrate layers comprised at least in part of one or more conductors in further communication with the structures of the extraction layer. Optionally, an interface layer can be applied to or with any aspect of an architecture, and can be comprised of one or more substances and/or apparatuses which mediate the interface between the architecture and its surrounding environment. The composition, structure, shape, orientation and other such properties of one or more aspects of the architectures achieve one or more charge attributes and/or thermal attributes (each, an attribute and, together the attributes as used herein) which facilitate a desired function of the architecture. In preferred embodiments, such properties collectively converge to impart the architecture with the ability to absorb, store, release and recover thermal energy while producing and rapidly extracting more charge as compared to known devices and methods.

In one example, one or more structures of the extraction layer facilitate charge transport. In another example, the agents produce excitons in response to radiation and thermal energy, and are in communication with the structures such that charge separation and transport occurs. In a further example, the substrate layer can be transparent to at least some radiation and have at least one electrically conducting surface. In yet another example, the agents are tuned for absorption of thermal energy (e.g., infrared radiation) to convert at least a portion of the thermal energy of the architecture itself into charge (with or without radiation or thermal energy from external sources); the conversion of thermal energy into charge in this manner provides a form of heat sink of particular value in embodiments involving devices adversely affected by elevated temperature (e.g., known PV devices), or which otherwise seek to dissipate thermal energy as a form of waste (e.g., by convection, such as with a fan installed inside a desktop or portable computer).

As another example, an interface layer can further integrate the architecture into an existing PV device or directly into an electrical component (e.g., a pacemaker, microprocessor, battery, display screen, or light emitting diode); and can include separate circuitry or other non-inventive features (e.g., an interface layer can be comprised in part of circuit board). In still another example, the interface layer can prevent or otherwise manage release of at least some radiation or thermal energy from the architecture (e.g., in the case of reflective materials or metamaterials which allow some radiation to enter but not to exit from the architecture). In other embodiments, the interface layer can be in communication with the substrate layer, on the opposite side as the extraction layer, or integrated directly into any layer, such as into the substrate layer such that the interface layer is enveloped by a portion of the substrate layer. In further similar embodiments, the interface layer can include one or more extensions which extend through, from and/or around any layer, and can terminate upon, within or apart from any other layer, including an additional interface layer. For example, an interface layer can be comprised in part of material which heats up during the day and then slowly releases heat at night, both by radiation and by conduction through extensions originating within the interface layer and terminating within the basal plane of the structures of the extraction layer.

In preferred embodiments, the architecture can be produced in a fabrication method comprising the following processes: deposition of a seed material onto at least part of a substrate layer; formation of structures which can be comprised at least in part of a seed material; activation to incorporate or otherwise provide one or more agents to one or more aspects; and, treatment to prepare any aspect of the architecture for application of any of the foregoing processes and/or use.

The fabrication methods provide synthesis of an integrated architecture for use in PV, PC and other applications: vertically-oriented, one-dimensional (1-D), mono- or polycrystalline, anatase $TiO_2$ nanowires in communication with a common transparent substrate or transparent conducting oxide (TCO) coated substrate; and which are intercalated with p-type semiconductors (e.g., quantum dots) such that separation occurs orthogonally over the nanometer-scale distance at each p-n junction following absorption along the micron-scale length of the nanowires.

The present invention provides means to simultaneously orthogonalize light absorption and charge separation while rapidly transporting photogenerated charge. Since there is no perfect light absorber, absorption is more fully achieved with thicker layers of light absorbing material. However, thicker layers generally result in slower or less efficient charge separation that in turn leads to unwanted charge recombination. This tradeoff between light absorption and efficient charge transfer has, for example, limited the nanoparticle-based photoanode thickness of modern liquid-based dye sensitized Grätzel solar cells (DSSC) designs to approximately ten microns; although a thicker photoanode layer enables greater light absorption, any benefit obtained with increased light absorption is offset by increased recombination of the photogenerated charges. In contrast, by orthogonalizing absorption and charge separation with structures that also facilitate rapid charge transport (e.g., to underlying electrical contacts), separation occurs over comparatively much smaller distances (i.e., on the order of nanometers versus microns) and absorption can be increased without incurring the sort of recombination penalties that plague known devices.

An object of the present invention is to provide for additional or alternative synthesis techniques, as well as further aspect compositions, structures, shapes and orientations resulting in integrated architectures which facilitate conversion of radiation and thermal energy into electrical and other forms of energy. This objective can be achieved in certain embodiments by manipulating the composition, structure, shape and/or orientation of one or more aspects to provide desired attributes in a given application.

FIG. 1 is a flowchart of a preferred embodiment of the anatase nanowire array fabrication method 10 in accordance with the teachings of the present invention. While each individual step of the method is shown in FIG. 1 the steps can be incorporated and/or removed, the sequence of steps can be modified as desired. Further, one or more steps can be performed at the same time as and/or together with one or more other steps, and any or all steps maybe performed continuously or in batch mode. Any or all steps may be performed multiple times and may be performed in any sequence of steps to iteratively produce the desired final nanowire array.

The present invention provides for completion of the following three steps: (1) deposition of titania on a substrate, (2) conversion of the titania to a titanate, and (3) treatment to produce crystalline anatase nanowires. In a preferred embodiment, the final product is a crystalline anatase nanowire array upon a transparent conductive oxide-coated glass substrate, of particular interest in the photovoltaic field. Alternatively, the final product is a crystalline anatase nanowire array film upon a transparent substrate such as glass, of particular interest in the photocatalysis field.

As a first step of a preferred embodiment shown in block 11, a clean substrate is used to promote adhesion of the dense titania layer. The substrate can be comprised of one or more types of glass, metal, ceramic, fiber, and/or polymer. The substrate can be a TCO-coated glass substrate. The TCO layer is comprised of one or more oxides, as may be selected from the group consisting of $SnO_2$, ITO, and FTO. A glass substrate coated with a transparent, electrically conductive layer is advantageous for many uses, such as in photovoltaic and photocatalytic applications. For example, FTO-coated glass can be used in the present invention. As a typical cleaning step, the FTO-coated glass substrate, or double-sided FTO-coated glass substrate, is cleaned using an ultrasonic bath: isopropanol for about 5 min, acetone for about 5 min, methanol for about 5 min, and water for about 5 min, then dried under nitrogen flow. As an alternative cleaning method, the substrate can be sonicated in a NaOH saturated ethanol solution for five minutes, thoroughly rinsed with de-ionized water, then dried under a stream of inert gas such as nitrogen or argon. It will be appreciated that a variety of other cleaning procedures can be used with the teachings of the present invention.

In block 20, a titania solution is prepared using a solvent. Example solvents include acetylacetone, acetone, butanone, pentanone, hexanone, or any other ketone can be substituted. It will be appreciated that a variety of solvents can be used over a range of concentrations.

In block 30, the substrate is coated with a titania film. The titania film can be amorphous, rutile, anatase, or a mixture of phases. Different routes can be used for depositing a thick titania film on the substrate. The film deposition technique is not critical nor is the composition of the starting dense titania layer. It is commonplace to use electroporetic deposition to fabricate thick titania films. Exemplary art on electroporetic deposition can be in Matthews et al. (D Matthews, A. Kay, M. Gratzel, *Electrophoretically Deposited Titanium Dioxide Thin Films for Photovoltaic Cells, Australian J. Chem.* 1994, 47, 1869-1877; and, L. Grinis, S. Dor, A. Ofir, A. Zaban, *Electrophoretic deposition and compression of titania nanoparticle films for dye-sensitized solar cells, J. Photochemistry and Photobiology A: Chemistry* 198 (2008) 52-59, each of which are hereby incorporated by reference into this application), and by Grimes et al. in US20130048947, which is also hereby incorporated by reference into this application.

With electroporetic deposition, the desired thickness is achieved through control of the titania solution concentration, applied voltage, and number of deposition steps. With dip-coating, the desired thickness of the starting dense titania film can be achieved through multiple dip-coating/annealing steps. With dip-coating, after deposition of each film layer it is advantageous to anneal the film to eliminate residual solvent and organic residue. This is achieved through heating of the sample to an elevated temperature, a few hundred degrees Celsius, for a duration of at least a few minutes. Any annealing or similar process to eliminate residual solvent and organic residue can be used to the same effect, for example rapid thermal (flash) annealing, IR annealing, thermal oven, hot plate, microwave oven and the like. A final annealing step after deposition of a film of desired thickness can be used to enhance film densification and remove any residual organics. For example, an oxygen or air anneal of the film at about 500° C. to about 550° C. for about 1 h to about 3 h can be used, with the higher temperature and longer duration resulting in a denser film.

It is has been found, unexpectedly, that P25 nanoparticles in a solvent can be used to prepare a thick $TiO_2$ film on clean conductive substrate surfaces in one or more steps without the use of an electroporetic application or an applied potential. For example, the $TiO_2$ film can have a thickness in the range of about 0.5 to about 50 microns and more preferably in the range of about 10 to about 20 microns. This result significantly decreases the time for preparation of thick $TiO_2$ films, and increases the commercial opportunity for photovoltaic and catalytic materials prepared using this new synthesis method.

In block 35 of a preferred embodiment, the glass substrate is coated with a protective coating to prevent damage to it from the solvents used to convert the dense titania film to nanowires during hydrothermal treatment. For example, the use of hydroxide solvents to that end will etch glass much more rapidly than the TCO coatings. Etching of the glass substrate upon which the TCO coating and nanowire film rest is deleterious for photovoltaic use, since much of the light incident upon the glass is scattered away from the solar cell due to specular reflection. Consequently, it is necessary to protect the glass substrate prior to hydrothermal treatment with such solvents. In one embodiment, the TCO coating is placed on both sides of the glass substrate. Double-sided TCO-coated substrates enable nanowire growth on both sides of the substrate; the nanowire array films on each side of the glass substrate could be made into solar cells or, alternatively, the nanowire film on one side can be used within the solar cell, the nanowire film on the other side serves as an anti-reflection coating. In another embodiment, the glass can be protected through use of a spin-on, evaporated, sputtered, spray-coated, or painted on film such as Polytetrafluoroethylene ("PTFE", aka Teflon®), poly (methyl methacrylate) (PMMA) dissolved in acetone, photoresist, a layer of sputtered metal or metals, such as Pt or Ni, or a sacrificial layer of spin-on glass or such other materials as are known in the art. If the titania film is applied via dip-coating, then both sides of the substrate will be coated with titania, hence the alkali protective coating will be deposited onto the titania coating that covers the glass surface of the substrate. If the titania film is deposited such that only one side of the substrate is coated, for example, electrodeposition or sputtering, then the protective coating is deposited directly onto the glass substrate.

In block 40, a preferred embodiment, the titania coated substrate is subjected to hydrothermal treatment to convert the dense titania layer into a nanowire array. The titania thick film can be converted into a nanowire array, vertically oriented from the substrate, by hydrothermal treatment using a solvent which may be selected from NaOH, KOH, LiOH, NH$_4$OH or RbOH, or mixtures thereof. For example, NaOH hydrothermal treatment can be used to provide a vertically oriented Na$_2$TiO$_4$ nanowire array. Alternatively, other hydroxide compounds can be used in hydrothermal treatment. The reactor used for nanowire formation can be comprised of a single or plurality of vessels, devices or the like operated in a batch or continuous manner, and heated by conductive, convective or radiant means, such as a thermally heated hydrothermal reactor or a microwave-heated hydrothermal reactor. The reactor can also incorporate one or more methods that facilitate dispersion or reaction of reactants, such as electrification, sonication, sparging, circulation, agitation or mixing. In a preferred embodiment, the titania film coated substrate is placed within a reactor containing NaOH, KOH, LiOH, RbOH or NH$_4$OH, or mixtures thereof within a molarity range of about 1 M to about 18 M, and heated within a range of temperatures, about 120° C. to about 340° C., for a duration ranging from about 0.25 h. to about 48 h, to convert the dense titania film into a nanowire array vertically oriented from the substrate. It is recognized that there is a balance between starting film density and thickness, between growth solution molarity and type, and between temperature and duration balance. For a 20 micron thick dense titania film, at about 5M NaOH, about 200° C. for about 2 h. duration, only approximately 10% of the dense nanoparticle film is converted into nanowires, while 100% nanoparticle to nanowire conversion efficiency can be obtained for the same time and temperature at 10M. However, in general, with a further increase in solution molarity beyond about 10 M the nanoparticle to nanowire conversion efficiency decreases because the newly formed nanowires will be re-dissolved. It is recognized that a less dense titania film is more prone to conversion by the solution. The optimal molarity depends upon the solvent, for example with KOH at about 200° C. 2 h. 18M can be used to fully obtain nanowire array films. Microwave-driven hydrothermal synthesis can be used for nanowire growth, significantly reducing the required processing time. Depending upon the size of the reactor, microwave power can be tailored to readily promote conversion of the nanoparticle film to a nanowire film. Depending upon the film thickness and molarity of the solvent used, microwave power levels can be used from about 50 W to about 5,000 W, with reactions times from about 30 s to about 6 h.

In block 50 the nanowire film, removed from the hydrothermal treatment, is rinsed in de-ionized water, or other suitable rinsing agent such as ethanol, acetone, ionic liquids, or cleaned in a stream of inert gas, to remove the residual alkali solution. This washing step is a generally preferred processing step, as typically without this washing step, when the nanowire films are subjected to the ion treatment, block 60, the nanowires collapse to particles and fall from the film.

In block 60, the nanowire array is treated with an acid, such as HCl or HNO$_3$, but the technique is general to other acids such as H$_2$SO$_4$, H$_2$SO$_3$, HClO$_4$, and the like. In the presence of NaOH aqueous solution during nanowire growth, for example, some of the Ti—O—Ti bonds are broken with Ti—O—Na and Ti—OH bonds formed. In treating the film with acid, for example HCl, the Ti—O—Na and Ti—OH bonds react with the acid and water to form new Ti—O—Ti bonds. In the case of NaOH treatment, for example, the resulting sodium titanate Na$_2$TiO$_4$ nanowires can be treated with HCl or HNO$_3$, etc. solution to provide a titanate H$_2$TiO$_4$ nanowire array. The acids can be used singularly or in combination with molarities ranging from about 0.01 M to about 5 M, or about 0.01 M to about 1 M with immersion times from about 10 min. to about 72 h, or about 10 min. to about 24 hours with either a single, prolonged immersion step or multiple shorter immersion steps. It is noted that although alkali hydroxides other than sodium can be used, such as RbOH, there will still be some sodium titanate bonds within the film due to leaching of sodium from the glass substrate.

In block 70, the titanate nanowire array film is annealed in the presence of gas, including oxygen, ambient air or the like, for conversion to anatase TiO$_2$. The annealing step is conducted before, during or after acid immersion. Any annealing process can be used to the same effect, for example rapid thermal (flash) annealing, infrared (IR) annealing, thermal oven, hot plate, microwave oven and the like. An additional quenching step may be incorporated. An oxygen or air anneal is used to convert the titanate nanowire array into an anatase TiO$_2$ nanowire array. A variety of time and temperatures can be used to anneal the nanowire away, in accordance with the teachings of the present invention. A suitable range of annealing temperatures, for example, about 225° C. to about 600° C., and durations ranging from about 0.01 h. to about 48 h. or can be used in the present invention. For example, the nanowire array can be air annealed at about 500° C. for about 2 h. A small nanowire diameter, about 10 nm to about 15 nm, prevents their conversion to rutile. The deposition, conversion and/or treatment steps can include the introduction of one or more dopants, or mixtures thereof, that shift the bandgap energy of the final anatase nanowire array. Such dopant or dopants can be selected from a group consisting of Ag, Al, As, Au, Bi, C, Cd, Co, Cu, Fe, Ga, Ge, In, Ir, N, Ni, Pb, Pd, Pt, Rh, Sb, Si, Sn, Ta, Tl, W, and Zn.

The deposition, conversion and/or treatment steps can include the intercalation of one or more organic and/or inorganic p-type semiconductors within the nanowire arrays (the nanowire arrays being n-type semiconducting anatase); the introduction of one or more dyes; and/or the intercalation of quantum dots, of one or more sizes, and of one or more compositions, with or without the use of one or more other materials for absorption of radiation, to sensitize the final anatase nanowire array for absorption of radiation.

The final crystalline anatase nanowire arrays produced by the inventive method can be used in a device to produce electricity, or a device to catalyze and/or promote chemical reactions. The nanowire array can be used as one or more electrodes within an energy storage device, including battery devices based upon use of lithium or other ions, such as Al, Mg, Na, Zn and the like.

For example, the fabrication method can result in formation of structures in the shape of high aspect ratio (e.g., large length to small width, such as 1,000 to 1) 1-D nanowires that are vertically-oriented from the plane of a common substrate, and that are composed exclusively of anatase $TiO_2$ having a monocrystalline structure with no grain boundaries. In such an example, the composition, structure, shape and orientation together impart favorable electrical and thermal attributes as follows: the high aspect ratio, surface area and porosity of the resulting nanowire array facilitate absorption, emission and utilization of radiation and thermal energy; the orientation of 1-D nanowires allows for orthogonalization of absorption and charge separation, which proceeds rapidly at the 1-D surface of the nanowires; and the use of monocrystalline anatase enables rapid extraction. In such embodiments, the wire dimensions, interwire spacing, aggregate surface area, orientation, crystallinity, and other characteristics can be manipulated as desired during formation and/or treatment by varying fabrication conditions and methods (e.g., pressure, temperature, time).

The fabrication method can be completed in one or more steps, in any sequence or simultaneously, and in a continuous or batch manner, and it will be appreciated that the fabrication method is not limited to a specific technique or series of techniques. For example, fabrication can involve one or more chemical and/or physical methods such as solution (e.g., spin-on, dip, aerosol, anodization, electrophoretic, lithographic), vapor (e.g., sputtering, evaporation, epitaxy, thermal, plasma, photo), mechanical (e.g., compression, casting, printing), and/or other techniques as will be appreciated by those skilled in the art. A preferred embodiment of the fabrication method involves several steps: depositions, followed in sequence by thermal treatment, chemical treatment (e.g., application of a protective coating, such as Teflon), formation, additional chemical and thermal treatment, and then a series of final treatment steps (e.g., to apply agents).

Many methods are known for the formation of nanostructures (e.g., wires, tubes, plates, flakes or feathers, or the like), such as template-assisted synthesis, sol-gel transcription processes, seeded growth mechanisms, hydrothermal synthesis, and electrochemical anodization. The properties of the resulting nanostructures in each case vary with the synthesis method. For example, the hydrothermal teachings of Grimes in the '786 application are preferred for synthesis of vertically-oriented, one-dimensional, monocrystalline, n-type anatase nanowires. In another example, localized chemical dissolution with controlled, field-assisted oxidation and dissolution reactions is preferred for $TiO_2$ nanotube formation. In both cases, such techniques allow for precisely-ordered, nanoscale self-assembly, with superior control over nanostructure composition, structure, shape and orientation.

In certain embodiments, one or more fabrication steps can be optionally excluded, such as, for example, in cases where $TiO_2$ structures are exclusively intended to absorb and produce charge from ultraviolet radiation (which can eliminate the need for activation); or, in cases in which the substrate layer is at least in part already comprised of a desired seed material (which can render deposition unnecessary). For example, the fabrication method can comprise the following processes: formation of structures comprised at least in part of a substrate layer which is at least in part comprised of a seed material; activation to incorporate or otherwise provide one or more agents to one or more aspects; and, treatment to prepare any aspect of the architecture for application of any of the foregoing processes and/or use.

For example, in embodiments involving vertically-oriented, 1-D, polycrystalline, anatase nanotubes, the preferred fabrication method involves formation of structures by anodization of a substrate comprised of titanium in an electrolyte comprising a fluoride ion source, a chloride ion source, or combinations thereof; treatment to achieve targeted morphological and mechanical properties, such as length, diameter, wall thickness, porosity, intertube spacing, and crystallinity; and, activation to incorporate one or more agents into and upon the resulting nanotube arrays (e.g., dopants, co-catalysts, dyes, quantum dots, inorganic and/or organic p-type semiconductors, and so on). For example, the activation step of such embodiments can occur during formation by introducing a nitrogen source into the electrolyte during nanotube formation to form nitrogen-doped titania nanotubes, or during treatment by annealing in the presence of nitrogen gas or plasma.

$TiO_2$ presents various advantages for the compositions and devices of the present invention—it is an abundant, low-cost, non-toxic, wide bandgap semiconductor that is associated with high photoactivity, chemical resistance, and thermal stability. The electrical and thermal characteristics of nanoscale $TiO_2$ structures are strongly related to their structure, shape and orientation, and are thus tunable in various embodiments, such as, for example, by varying synthesis conditions (e.g., reactions, times and temperatures) to achieve more or less atomic-scale defects (i.e., lower or higher crystallinity) or larger or smaller nanostructures (e.g., to increase or decrease the surface area available for agent intercalation).

The seed material need not be comprised of titania, but rather any substance or combination of substances which results in structures having properties (composition, structure, shape, and orientation) giving rise to favorable attributes. Likewise, while structures comprised at least in part of the anatase mineral form of $TiO_2$ are employed in various preferred embodiments, one or more structures in such and other embodiments can be additionally or alternatively comprised at least in part of one or more substances selected from the group consisting of antimony, aluminum, arsenic, bismuth, carbon, cadmium, cobalt, copper, gallium, germanium, gold, indium, iridium, iron, lead, mercury, nickel, molybdenum, niobium, nitrogen, oxygen, palladium, phosphorus, platinum, ruthenium, selenium, silicon, silver, strontium, sulfur, tin, tantalum, tellurium, titanium, tungsten, vanadium and zinc, and/or any derivative or mixture thereof. Further, just as anatase $TiO_2$ is comprised of titanium and oxygen, the substances comprising the structures of certain embodiments can be incorporated in various combinations such as $Fe_2O_3$, $Nb_2O_5$, $SrTiO_3$, $Ta_2O_5$, $TaON$, $Ta_3N_5$, $TiO_2$, and $ZnO$, or other combinations. It will be appreciated that the composition of the structures can be selected and/or modified for optimization of attributes for a given application (e.g., for decreased thermal conductivity or increased emission of radiation), and that the novel architectures of this invention are not limited to structures having a particular composition.

The structures of the inventive architecture are further characterized by their mechanical structure (e.g., mono- or poly-crystalline); shape (e.g., 1-D, aspect ratio, wires, tubes, particles, pores, holes, or wells); and, orientation relative to the plane of the substrate layer (e.g., perpendicular, parallel, or random).

The degree to which a structure is able to rapidly separate and transport charge is in part determined by its mechanical structure; such as, crystal form (e.g., tetrahedral), relative degree of crystallinity, and the presence or absence of one or more impurities, defects, and/or grain boundaries. For example, monocrystalline structures are generally capable of enhanced charge and heat transfer properties as compared to their polycrystalline counterparts due in part to the absence of grain boundaries. Thermal attributes are subject to similar determination.

In various embodiments, the structures can be aligned to be perpendicular to the substrate layer such that radiation incident upon the architecture passes into the extraction layer and is absorbed along the micron-scale length of vertically-oriented structures while separation proceeds orthogonally to the direction of absorption. In this manner, the orientation of the structures provides for improved conversion efficiency by promoting increased separation and transport and decreased recombination.

While structures vertically-oriented from the substrate layer are preferred, it is recognized that a film comprised at least in part of a random array of structures (e.g., nanowires or nanotubes) can offer advantages in device performance over that of a non-textured film. Such films can have charge attributes and thermal attributes that are desirable in particular applications (e.g., energy storage or catalysis). For example, an architecture incorporating randomly-oriented structures can be further incorporated into a TPC device designed to catalyze a chemical reaction (e.g., reduction of carbon dioxide in combustion exhaust) upon absorption of ambient infrared radiation emissions from multiple directions (e.g., from the combustion apparatus). In another example, an extraction layer can incorporate more than one type of structure, such as vertically-oriented, 1-D, monocrystalline, nanowires with one set of charge attributes and thermal attributes, and randomly-oriented, 2-D, polycrystalline, nanoscale plates with another set of attributes. In still another example, an extraction layer can incorporate a horizontally-oriented, 1-D, crystalline sheet comprised of graphene in the shape of a grid or coil, with vertically- or randomly-oriented nanostructures formed at least in the spaces between the lines of the crystalline grid or coil.

With respect to the use of 1-D structures for conversion of ambient infrared photons, consider a non-symmetrical, vertically-oriented, rectangular nanowire array in which the nanowires have a cross sectional area of 8 nm×8 nm and length of 6 µm, and center-to-center wire spacing of 14 nm. In such a geometry, the ratio of surface area along the length of the nanowires (nanowire facing nanowire) to that at the end of the nanowires (e.g., the tip or top-most surface area of the nanowires) is 3,003 to 1. That is, the nanowire-facing-nanowire surface area is approximately 3,000 times greater than the nanowire surface area that faces outwards away from the device. If placed in an ambient temperature environment, devices incorporating the architecture will obtain the approximate ambient temperature of 300 K (e.g., room temperature) and emit electromagnetic radiation with a radiant intensity of about 500 W/m$^2$ or 0.05 W/cm$^2$ and a maximum emission at approximately 10 µm. Such emissions fall exclusively within the infrared spectrum: 22.5% ranges from 3.0 to 9.0 µm (MWIR); 38.9% is between 9.0 and 15.0 µm (LWIR); 21.3% is between 15 µm and 20 µm (FIR); and the remaining 17.3% is between 20 µm and 1 mm (also FIR). In the case of a smooth surface, this radiation would be uniformly emitted outwards, away from the surface. However, in the case of a 1-D nanowire array with the dimensions given above, for every photon emitted outward by the tip of the nanowire array surface, away from the device, approximately 3,000 photons will be generated along the length of each of the nanowires within the basal plane of the extraction layer. Moreover, large effective surface areas provide a maximum number of oxidation and reduction sites in catalytic applications.

It is desirable for the structures to orthogonalize photon absorption and charge separation while providing a high surface area for absorption or emission of radiation and/or thermal energy—exogenously, to or from substances outside of the architecture, and/or endogenously, to or from aspects within the architecture. Alternative shapes and orientations affording high surface area can be used for desirable aspect-to-aspect absorption and emission properties within the plane of the extraction layer (e.g., vertical, tapered or conical-shaped wires, rods or tubes, or particles, plates, flakes, feathers, springs, coils, scaffolds, and so on). While 1-D crystalline structures are ideally suited for rapid charge separation and subsequent charge transport, two-dimensional (2-D) materials can also be utilized in various high surface area embodiments (e.g., elongated, conical, tapered, or shaped spring-like, plate-like, flake-like, or feather-like geometries). Radiation absorption and charge separation are still orthogonal in such structures (which offers an improvement over conventional bulk devices), however, the 2-D morphology results in decreased charge and increased heat transfer as compared to 1-D structures due to the additional degree of freedom.

The mechanical and morphological properties of the structures which comprise at least part of the extraction layer are not limited to specific structures, shapes or orientations. Importantly, the fabrication method can tune or impart the structures with properties desired for attribute optimization in given applications. For example, substances and hydrothermal reaction times can be prescribed to increase or decrease nanowire length or diameter or interwire spacing to facilitate less or more radiative emissions within the extraction layer; or, conditions during an annealing step can be changed to form structures having favorable charge attributes and characteristics known to frustrate heat transfer in embodiments in which low thermal conductivity is desired. For example, thermal conductivity is known to decrease with decreasing diameter in nanowires, an effect believed to be caused by reduced opportunities for propagation of lattice vibrations. Surface roughness, defects and impurities are additionally known to decrease thermal conductivity as such features scatter phonons and impede the flow of heat. Such characteristics are amenable to manipulation during fabrication. The fabrication method can be completed in one or more steps, using one or more techniques, including such techniques as are generally known to those skilled in the art, in any sequence or simultaneously, or in a continuous or batch manner in consideration of such and other optimization objectives.

Property selection and tuning for attribute optimization is not limited to any specific aspect. In various embodiments, the activity layer is comprised at least in part of agents which absorb electromagnetic radiation of desired wavelengths and convert that energy into charge, such as dopants, dyes, quantum dots, organic or inorganic substances, or other substances as are known to those skilled in the art.

As is widely recognized, a semiconductor of a given composition possesses a specific band gap energy which enables absorption of and charge production from radiation of specific wavelengths. However, semiconductor nanoparticles (e.g., quantum dots) have demonstrated strong potential for radiation harvesting as their absorption spectrum is additionally derivative of particle size. For example, it is known that the band gap of bulk (solid) PbS is approximately 0.29 eV, while the band gap energy increases to approximately 0.6 eV for 10 nm diameter particles, and 2.32 eV for 0.24 nm diameter particles. Semiconductor nanoparticles of about 2 nm to 20 nm in diameter have shown excellence performance in IR absorption.

The utilization of such materials has been historically challenged by high extinction coefficients, with lifetimes far too short (e.g., femtoseconds) for such methods to be effective using devices incorporating known charge separation and transport techniques. Further, while semiconductors having small band gap values are suited for absorption of wavelengths emitted by low grade thermal energy resources (e.g., with temperatures of less than 470 K), such materials are especially susceptible to photocorrosion losses absent rapid separation. Minimizing and preventing such losses is an important objective of the invention.

The band gap of a quantum dot of fixed composition can be manipulated through control of its size. In embodiments involving structures comprised of vertically-oriented, 1-D, monocrystalline, n-type anatase nanowires, intercalated with agents comprised of the zero-dimensional, p-type quantum dots, charge separation proceeds rapidly at each structure-agent interface, with less recombination, thermalization and photocorrosion as compared to known devices.

Semiconductor compositions suitable for absorption of and charge production from radiation are known; including for absorption of infrared radiation. IR-absorbing compositions can include binary compounds, such as AlAs, AlSb, CdS, CdSe, CdTe, FeS, GaAs, GaSb, HgTe, InAs, InN, InP, InSb, PbS, PbSe and PbTe, and ternary compounds, such as CuZnS, InGaAs, PbSnTe, HgCdTe, $Zn_xCd_{1-x}Se$ ($0 \le x \le 1$), and $CdTe_xS_{1-x}$, any mixture or derivative of the foregoing, and such other substances and compounds as are known to those skilled in the art. The stoichiometry of such and other agents can be tuned for one or more applications.

For example, PbSnTe is appealing for IR harvesting applications since the band gap of the semiconductor can be made a function of temperature (for example, with $Pb_{0.18}Sn_{0.82}Te$ or $Pb_{0.85}Sn_{0.15}Te$) through changes in relative composition. Relatively temperature-insensitive radiation absorption and charge generation can obtained by combining the two such compositions within a device structure; for example, through use of alternating activity layers of $Pb_{0.18}Sn_{0.82}Te$ and $Pb_{0.85}Sn_{0.15}Te$ quantum dots with a cumulative gradation in nanoparticle size across the thickness of the extraction layer, starting with smaller size (larger band gap) nanoparticles nearer to the surface upon which the radiation is incident. In another example, use of PBDTT-DPP:PCBM bulk heterojunction polymers has been demonstrated for harvesting of NIR.

It will be appreciated that the agents of the inventive architecture are not limited to specific compositions, structures, shapes (e.g., geometries and sizes), or orientations, or to specific charge attributes or thermal attributes. Instead, agent properties can be selected and/or tuned for optimization of attributes for a given application. Agents can have one or more structures, shapes, or orientations, and can include various forms such as quantum dots or other nanoparticles, sheets, shells, tubes, wires, rods, branched networks, pores, wells, holes, engineered structures (e.g., nantennas, metasurfaces, metamaterials), or other structures having the capability of absorbing radiation and/or thermal energy and converting that energy into charge. An activity layer can incorporate agents intended to produce additional agents, for example, through the use of an engineered structure to form surface plasmon agents. Agents can be alternatively tuned for other action, such as the reflection, refraction, focus or diffusion of radiation; or charge production directly from thermal energy (e.g., with one or more thermoelectric (TE) materials); or to form electrical contacts; or to facilitate an objective of a contiguous device (e.g., one or more agents which form a near field magnetic induction coil within the activity layer). In various embodiments, agents can be comprised of one or more substances, or combined with one or more other agents (e.g., particle having one composition within a shell of another composition), or applied with one or more other agents having the similar or disparate compositions, shapes and dimensions in one or more activity layers (e.g., a consortia of quantum dots in a first activity layer, followed by PBDTT-DPP:PCBM bulk heterojunction polymers in a second activity layer).

Architectures in embodiments which absorb at least a portion of the electromagnetic spectrum, convert the energy of the absorbed electromagnetic waves into electron-hole pair excitons (charge), which generate electricity once separated and transported to an electrical contact. It is thus of particular interest in such and other embodiments to utilize a substrate transparent to radiation having one or more wavelengths.

Glass is known as to have utility in photovoltaics since it is transparent to visible radiation; in this way, visible light passes through the glass substrate for absorption and charge production in the activity layer. In preferred embodiments, a substrate layer can be glass which has been coated with a conductor, such as such as a transparent conducting oxide (TCO) (e.g., tin oxide ($SnO_2$), indium tin oxide (ITO) or fluorine-doped $SnO_2$ (FTO)), which can be in direct communication with the structures of the extraction layer such that the conductor facilitates charge extraction to electrical contacts. The fluorine-to-tin ratio of FTO films can be selected and/or tuned to control such attributes as resistivity, charge carrier density, charge carrier mobility, and wavelength-dependent optical absorption properties. For example, electrically conductive FTO films transparent to radiation across the LWIR band have been demonstrated. Additional substances known to be transparent to IR include Ge (2 µm to 20 µm), ZnS (1 µm to 12 µm); ZnSe (0.7 µm to 18 µm), GaAs (2 µm to 30 µm), AgCl, NaCl, KCl, CdTe, and Te-doped, n-type GaSb (all transparent across the LWIR band).

The substrate can be of any size or shape (e.g., flat, round, cylindrical, honeycomb); it can be rigid or flexible; it can be comprised of one or more types of glass, metal, ceramic, fiber, and/or polymer; it can be woven into a fabric or incorporated into a part of another structure; and it can be tuned to alter the properties of the substrate to promote utilization of radiation and thermal energy by the architecture. For example, selecting and/or tuning the substrate to increase opacity to at least some radiation will lead to thermalization of the substrate layer in PV applications where the increased thermal energy could be conducted to high surface area structures of an extraction layer having properties tuned for emission of radiation. A substrate layer can be selected and/or tuned during completion of the fabrication method for low thermal conductivity, or further coated (e.g., on a surface opposite to the FTO coating) with one or more substances that reflect infrared radiation (e.g., to prevent emission outside of the architecture).

Should it be desired to store and then convert thermal energy to electricity at a specific rate, a substrate insulating to thermal energy can be used to separate the architecture from a heat reservoir, where the heat capacity of the substrate is selected and/or tuned for the retention of thermal energy within the architecture. $Y_2O_3$-stabilized $ZrO_2$, for example, has a heat capacity of 2 W/mK; a layer comprised of such substances would act as a 'heat battery' that could be used to control the rate of energy output if placed between a heat source and the architecture.

It is recognized that conductors can include a variety of electrically conductive, radiation transparent or translucent substrates, including nanostructured materials such as graphene or composite layers of semiconducting or metallic carbon nanotubes. Conductors can alternatively be comprised at least in part of the substances which further comprise any other aspect. Further, the invention is not limited in use to any particular conductor or means of charge collection. For example, an alternative approach to making an electrical contact that is largely transparent to incident radiation is to use a periodic grid of electrically conducting wires, with a wire-to-wire spacing dependent upon radiation wavelength and mobility of the photogenerated charges; as desired the electrically-conducting grid can be placed upon the top surface of the semiconductor, as is commonly done for silicon photovoltaics, or upon the underlying substrate upon which the photovoltaic device is built.

It will be appreciated that fabrication methods can be established to form aspects which can have myriad combinations of properties. However, the architectures of various embodiments involving charge production from radiation and thermal energy are comprised at least in part of aspects that: (1) are transparent to at least some radiation; (2) absorb and produce charge from radiation and/or thermal energy; (3) have a high surface area for absorption of radiation and thermal energy, emission of radiation, and agent intercalation; (4) orthogonalize absorption of radiation and charge separation; (5) have a charge carrier mobility greater than or equal to the bulk value for the substance(s) comprising the structures, and (6), have a thermal conductivity less than or equal to the bulk value for the substance(s) comprising the structures. For example, the structures of a PV embodiment can include vertically-oriented, 1-D, monocrystalline, anatase $TiO_2$ nanowires formed upon a FTO-coated substrate, intercalated with a consortia of quantum dots selected and/or tuned for absorption of radiation (including IR); where the nanowires have a length to width (diameter) aspect ratio of at least 2 to 1, interwire spacing at least equal to the radius of the nanowires, thermal conductivities equal to or less than 8.5 W m$^{-1}$ K$^{-1}$, and charge carrier mobilities equal to or greater than 0.1 cm$^2$/(V·s) or more.

An important aspect of the current invention is that the charge production architecture of the device, comprised of an ordered or random 1-D architecture intercalated with a radiation absorbing semiconductor, can be utilized, as desired, to harvest different and/or complementary portions of the electromagnetic spectrum. For example, an architecture which incorporates semiconductor aspects having band gap energies suitable for absorption of infrared radiation can be used to harvest both infrared radiation and visible light radiation by way of multiple exciton generation (MEG) and harvesting. MEG is a process in which absorption of a single photon produces multiple electron-hole (exciton) pairs; in bulk semiconductors the event is called impact ionization. MEG offers the potential for a tremendous advance in photovoltaic conversion efficiency with the (above band gap) energy in part by producing and successfully extracting multiple excitons upon absorption of qualified photons.

MEG efficiency is determined by the competition between Auger-type, carrier-carrier interactions, and intraband relaxation. Quantum dots have demonstrated the potential to achieve MEG due to the confined proximity of the electron and hole wave functions, although many factors affect the amount of additional energy required for carrier multiplication including the shape and size distribution of the quantum dots, surface effects and defects, and the adjacent location of external charges.

It has been theorized that, beyond the MEG threshold, charge carrier multiplication increases linearly with photon energy; that is, a continuous increase of quantum efficiency is obtained with increasing photon energy relative to that of the semiconductor band gap energy. However, while MEG has been demonstrated in laboratory settings, with evidence of MEG based upon shifts in charge carrier recombination spectrums, there is as of yet no PV device able to utilize the physical phenomena of MEG for improved device performance for the following reason: while single excitons undergo relatively slow radiative recombination, typically on the order of hundreds of nanoseconds to microseconds, multi-excitons decay much more rapidly, typically on the order of picoseconds, due to Auger recombination. It is not possible to separate and collect these multi-excitons rapidly enough to prevent their recombination with known technologies.

The inventive architectures provide a means for realization of MEG. For example, an architecture can include an anatase $TiO_2$ nanowire array intercalated with InSb nanoparticles having a diameter of 20 nm and a bandgap energy of 0.17 eV. The 0.17 eV bandgap energy corresponds to a cut-off wavelength of 8 µm, which corresponds to the spectral radiancy maximum of a 363 K material. Photons incident upon the architecture possessing an energy greater than the 0.17 eV InSb bandgap but less than 0.34 eV, corresponding to photons with wavelengths ranging from 4 µm to 8 µm, will generate one electron-hole exciton per photon and increase the thermal energy of the architecture with the differential energy above the bandgap value. As the architecture reaches ambient temperature, the nanowire structures will emit at least some radiation having a spectral radiancy maximum of 8 µm within the basal plane of the extraction layer. This radiation will, in turn, be absorbed by the InSb nanoparticles intercalated between the nanowires and converted to electricity. Photons incident upon the architecture having energy greater than 0.34 eV will produce multiple exciton pairs for each photon. As the photon energy continues to increase (e.g., a green photon of 510 nm wavelength has an energy of 2.43 eV), a corresponding increase in multiple exciton generation will occur. The rapid separation of the electron-hole enabled by the interpenetrating nanoscale surface topology, and the rapid transport of the separated charges offered by the properties of the structures, enable efficient charge collection. Rapid, efficient collection of the photogenerated charges prevent photocorrosion of the low band gap radiation absorbing InSb. The result is a stable architecture capable of converting broad spectrum radiation, as well as the thermal energy that would otherwise interfere with device operation, to electricity.

In another example, n-type anatase $TiO_2$ nanowires (with a bandgap energy 3.2 eV) are grown and reside upon a FTO-coated glass substrate. A second FTO-coated glass substrate is used as a counter electrode in contact, either directly or through an intermediate buffer layer, with a p-type semiconductor. Nanoparticles of p-type InSb are intercalated within the nanowires with a gradient in particle size and energy bandgap. The lower bandgap energy nanoparticles (0.17 eV in the case of InSb) are larger where the nanowires contact the FTO layer. The nanoparticles become smaller as they approach the counter electrode, with a corresponding increase in bandgap energy. The FTO substrates permit ultraviolet, visible and infrared photons into the device. For radiation incident upon and passing through the counter electrode, the photons are proportionally absorbed as they pass through the high bandgap materials (absorbing shorter wavelength photons) into the lower bandgap materials (absorbing photons of longer wavelength). For radiation incident upon the first substrate layer, high energy photons pass through the substrate and extraction layers and generate multiple excitons upon contact with the low band gap agents in the activity layer in relative proportion between photon energy and absorber bandgap. IR absorbed by the substrates thermalize the architecture until achieving ambient temperature; radiation is then emitted by the substrates and other aspects and reabsorbed by the low bandgap agents. Ultraviolet light will be at least in part absorbed by the $TiO_2$ structures (depending upon the thickness of the extraction layer), and contribute to charge production. UV photons passing through the $TiO_2$ layer would generate multiple exciton pairs in the low bandgap agents, with the electron-hole pairs rapidly separated at the structure-agent interface.

Although various methods, compositions, devices and applications of the present invention have been disclosed, it is understood that the invention is not limited to the specific methods, compositions, devices and applications disclosed hereinabove.

For example, a new class of TPV device is disclosed herein which simultaneously utilizes radiation and thermal energy to produce energy; and, which is comprised of, integrated into, and/or in communication with one or more host sources of radiation and thermal energy. In preferred embodiments, such TPV devices incorporate the architecture of the present invention. In other embodiments, such TPV devices absorb radiation and thermal energy from the host (and/or the host's surroundings) and produce electricity which powers the host. In another embodiment, a TPV device can be in communication with a microprocessor host that transfers thermal energy to the TPV device, which, in turn, provides charge to the host or other proximate components, thereby reducing the power drawn from other sources. In such embodiments, the TPV device need not be in direct communication with the host but can be incorporated into the host apparatus (e.g., desktop computer or light emitting diode housing) in a manner that allows the TPV device to receive radiation and/or thermal energy from one or more sources located within and/or outside of the host apparatus.

Other devices incorporating the inventive architectures include new variations of TPV cells that have the capability of producing power in ambient and reduced temperature environments. In one embodiment, a TPV cell based on the integrated architecture absorbs a portion of the radiative and thermal flux in an urban center (e.g., city). An apparatus comprised at least in part of such TPV cells could use the city's own heat to reduce the city's consumption of power from non-renewable sources, while simultaneously providing a heat sink (e.g., by converting thermal energy to extracted charge) that would help to ameliorate the city's so-called 'heat island' effect. For example, and in contrast to known PV devices, the TPV device would not be constrained by the need to orient itself to track any source of radiation, but would instead simply access the omnidirectional thermal energy flux (and it would keep doing so at night).

In another example, a TPV device based on the integrated architecture provides power to a portable electronic device (e.g., mobile phone or media player). In contrast to PV powered devices, which are designed to access a solar flux containing about 1,000 watts/m^2, a TPV device based on the integrated architecture would access an energy flux containing about 900 watts/m^2, and it would do so without having to orient itself to track the sun. For example, the exterior of 3 meter tall, 10 centimeter diameter pole on a city street corner can be covered with TPV cells based on the architecture. With a surface area of about 1 m^2 and at an assumed conversion efficiency of 10%, such a device would harvest about 90 watts/m^2, or a continuous 90 Joule/second (J/s). A standard iPhone™ (available from Apple Inc., of Cupertino, Calif.) battery (32G Battery 3.7V 1420 mA) would charge with 19,080 Joules; thus, a fully discharged battery would be recharged in about 3.5 minutes by using such a device incorporating the architecture.

The ability to efficiently convert infrared photons to electricity enables the practical use of reflected, unused or otherwise wasted radiation. For example, the majority of the environment inside and surrounding an electronic device includes objects that possess thermal energy. The electronic device in most cases would be immersed in a flux of infrared radiation emitted from many directions by many sources. Those sources are additionally candidates for thermal energy transfer. As would be appreciated by the manufacturer of such electronic devices, the utility and marketability of such electronic devices would not be limited, for example, by a user storing an electronic device in a shirt pocket.

In another embodiment, a personal electronic device user with an average surface area of 1.75 square meters emits about 1,000 Watts of infrared radiation and receives about 900 Watts from the environment (an amount which varies based on location and conditions), giving 1,900 watts/1.75 m^2=1,086 W/m^2=0.11 Watts/cm^2. A thermophotovoltaic array operating at 10% efficiency would harvest about 0.01 Watts/cm^2 and, at the size of a standard shirt pocket (120 cm^2), and a continuous 1.2 Watts=1.2 Joule/second (J/s). The common smartphone battery described above (32G Battery 3.7V 1420 mA) would charge with 19,080 Joules. Thus, a fully discharged battery for that device would be recharged in 15,900 seconds, or about 4.4 hours. Since a personal electronic device having those specifications has a typical power consumption of between 0.7 Watts (idle) to about 1.3 Watts (full utilization), a personal electronic device incorporating a TPV device containing the inventive architecture would be sufficient to keep that personal electronic device in a constant state of charge.

The vast majority of the solar flux never comes in contact with the surface of the cell, but is instead collected and stored by the earth and environment surrounding the device in the form of thermal energy. For example, the sun has an effective temperature of about 5,800 K, which corresponds to a maximum irradiance of 0.5 μm and a radiant intensity of about 1,000 W/m2 at the earth's surface. Approximately 53% of the energy in the solar flux is in the infrared (IR) spectrum (with wavelengths of 740 nm to 1 mm); another 44% is in the visible light spectrum (with λ ranging from 400 nm to 740 nm); and the remaining 3% is in the ultraviolet (UV) spectrum (10 nm to 400 nm). Devices incorporating the inventive architecture could additionally be used, for example, in standard photovoltaic applications as an alternative to known PV devices or to simultaneously improve performance of a pre-existing solar power production installation. For example, the p-type activity layer of a device based on the invention could be in further communication with the surface of a conventional n-type solar cell, such that incoming sunlight flows through the architecture first and then into the pre-existing PV device. TPV devices incorporating the architecture can be utilized for concentrated solar thermal applications (most silicon solar cells become inert after reaching 100° C.).

As another example, the TPV device is incorporated into and powers an injectable or implantable medical device. Such a device could be powered by the patient's body heat, via radiation, conduction and/or convection. In various embodiments, such devices could be used for analysis of patient health and other factors; collection, storage and transmission of analytical data; localized or system-wide thermal management; to dispense pharmaceutical agents; to affect the synthesis and/or function of tissues, proteins, hormones or other compounds; or in conjunction with a means of destroying targeted tissues. In still other embodiments, a thermophotovoltaic device could be incorporated into an implant, such as a pacemaker or powered artificial limb.

In another embodiment, a thermophotovoltaic array feeds off of waste heat produced by components within the personal electronic device. The array is contained within the personal electronic device, in a configuration at least in part in proximity to components which generate thermal energy. In some variations, the thermophotovoltaic array could be integrated directly into personal electronic device components, such as one more of the battery, processor or circuit board. In others, more than one thermophotovoltaic array can be included in more than one location within the personal electronic device. For example, a thermophotovoltaic array can be incorporated into one or more layers of a coating, substrate and/or covering which provides or is part of the exterior of the personal electronic device. In still other embodiments in which the thermophotovoltaic personal electronic device has surplus charge available, the thermophotovoltaic array is integrated with elements which act as storage medium for thermal energy. In other embodiments, thermophotovoltaic personal electronic devices absorb radiation and/or thermal energy and convert at least some of the heat generated by the personal electronic device into additional charge, thereby providing for improved component performance and battery life, and increased optionality for personal electronic device design (e.g., to incorporate larger or a greater number of processors or other components).

While the thermophotovoltaic cells disclosed herein will, in various embodiments, produce charge upon absorption of light that a standard cell would convert, other embodiments of the present invention are designed to access that radiation indirectly, for example, by absorption of thermal energy from the black substrate, backing or other exterior surface of a smart phone or other personal electronic device. In addition, since infrared radiation will penetrate material, such as metal or plastic, further than visible light, the integrated architecture can be incorporated into packages opaque to visible light. In still other embodiments, a device based on the integrated architecture disclosed herein could also be incorporate into a substrate (e.g., indium tin oxide coated polyethylene terephthalate (PET)) tailored for conversion of infrared radiation to electricity, which could in turn be placed within or as a part of the black polycarbonate package (e.g., exterior) of the electronic device. Inside the package, although opaque to visible light, externally derived infrared radiation is still received by the integrated device (e.g., from sunlight or other sources), and converted to electricity that can be used to power the device. In this way an electronic device, such as a phone, smart phone, GPS locating device, electronic beacon, and other such devices can continually charge or recharge itself by converting ambient infrared emissions into electricity.

In catalytic embodiments, infrared radiation and thermal energy are waste products in industrial processes such as hydrocarbon cracking and hydrocarbon combustion, such as that associated with combustion engines. For example, 1-D anatase nanowires intercalated with infrared absorbing quantum dots can be used to absorb this energy and generate electron-hole pairs which can be used to decompose high molecular weight hydrocarbons into smaller (more volatile) components prior to combustion (thereby improving fuel economy and decreasing emissions). In another example, a thermophotovoltaic device is in communication with and heated by combustion exhaust, and then uses the derivative thermal energy and infrared radiation to produce charge which can then be used to reduce carbon dioxide (with a source of hydrogen) into synthesis gas for recirculation to the combustion engine. Alternatively, the electron-hole pairs can be used to split water to form hydrogen and oxygen, in the reduction of nitrogen oxides, or the like.

The charge-carrier output rate from the architecture can be controlled, allowing precise power delivery, through the temperature and thermal conductivity of the substrate. In an alternative embodiment, the architecture can be used for conversion of heat to infrared radiation which is then emitted to the surrounding environment. Similarly, the radiation absorbing properties of the architecture and material intercalated within the crystalline structures can be selected to achieve interrelated functionalities. As an illustrative, but not limiting example, the dye composition, and/or bandgap and size of quantum dots, and/or p-type semiconductor composition, intercalated within the crystalline structures can be selected to absorb radiation incident from a specific source, and for a specific wavelength or range wavelengths. This can be, for example, solar spectrum radiation, infrared radiation from an electronic device such as a microprocessor, or infrared radiation emitted by a living person. Similarly, other quantum dots intercalated within the crystalline structures can be selected to absorb infrared radiation, of similar or different wavelength, generated by the architecture due to its associated thermal energy. As desired, the thermal conductivity of the 1-D nanostructures and that of the substrate and temperature upon which they rest can be adjusted to promote the desired rate of thermal heating and subsequent emission of infrared radiation. Further, thermalization of the excess energy associated with absorbed photons, that is photon energy above that of the semiconductor bandgap, can be used within the structure to heat the crystalline structures, e.g. anatase nanowires, in turn generating infrared photons that are subsequently converted to charges.

The novel functionality of devices containing the architecture can be further illustrated with the following example: 1-D crystalline structures layer rest upon a substrate of which both the thermal conductivity and radiation transparency can be controlled. A glass layer coated with a layer of optically transparent fluorine-doped tin oxide (FTO) supports or lies adjacent to an electronic display, such as that associated with a computer or smart phone, which display presents visible images such as pictures or text. In this example the architecture includes an array of n-type 1-D anatase nanowires. Infrared radiation will pass through the display, glass and FTO layer, reaching the 1-D nanowire array adjacent to the substrate. When coupled with dopants, quantum dots, and/or dyes, and/or p-type semiconducting materials of a bandgap suitable for absorption of infrared photons, electron-hole pairs are generated, efficiently separated at the interface with the nanowire, and rapidly separated and subsequently transported to the electrical contacts. In this way ambient infrared radiation can used to continually power the electronic device making use and/or controlling the display, or similar such device. Waste heat associated with electronic components, such as microprocessors, that control electronic displays can be moved to the nanowires by emission, conduction or convection, with the nanowires in turn emitting infrared radiation that, in turn, is converted to charge carriers and electricity by the infrared absorbing semiconductor materials intercalated within the nanowires.

It is recognized that highly efficient solar cells can be achieved, with a sunlight to electricity conversion efficiency of approximately 45%, when multiple junctions are used with each semiconductor junction designed to respond to given portion of the solar radiation spectrum. Such photovoltaic devices are extremely expensive, necessarily comprised of several tens of high purity, distinct layers fabricated using molecular beam epitaxy. In contrast, the combination of, in particular, 1-D crystalline anatase nanowire arrays with spray or solution cast semiconductor quantum dots can achieve the same broad-spectrum performance. Such an integrated device is achieved by fabricating a film of single crystal anatase nanowire arrays upon fluorine-doped indium tin oxide (FTO) coated glass, as taught by U.S. Patent Application Publication No. 2013/0048947, or by use of multiple extraction, activity, substrate and/or interface layers.

Solar radiation is incident upon the glass/FTO substrate, passing to the anatase nanowire layer where the ultraviolet radiation is absorbed and, in turn, electron-hole pairs generated. This absorption of ultraviolet radiation promotes quantum dot stability, since it is the high-energy photons that do most of the photocorrosion damage to a material. Upon the anatase nanowire layer are placed quantum dots tuned for visible light absorption, with subsequent layers of quantum dots designed for absorption of increasingly longer wavelength photons. Since charge is passed not sequentially through multiple junctions, but rather to the anatase nanowire that serves as an 'electron highway' passing between the quantum dot layers, the depth of the radiation absorbing quantum dot layer is not limited by charge hopping between neighboring quantum dots where charge recombination can occur. In this way, highly efficient broad-spectrum photovoltaic devices can be achieved in a novel, cost effective manner. In some such embodiments, thermalization simultaneously contributes to overall efficiency by causing the emission of infrared photons which are then absorbed by the integrated architecture disclosed herein. In still other embodiments, the substrate, the crystalline structures and/or the activity layer can be further modified to include structures or features which store and/or concentrate thermal energy, or which redirect or focus radiation.

Impervious surfaces in the U.S. are estimated at 120,000 $km^2$, with a growth rate of 1,000 $km^2$ per year. Of this approximately ⅔ is pavement, and ⅓ is roofing. According to U.S. Census data, the rooftops of the United States alone offer over 20 $Gm^2$ of potential (practical) surface area for the installation of PV systems. While rooftop PV systems are not uncommon, rooftop installation (above the roof) poses issues such as rooftop wind or water damage. It is estimated that sealing and installation of rooftop mounted PV systems cost approximately $80/$m^2$ (glass, aluminum frame, mounting brackets, etc.)

Bituminous or asphalt roofing represents some 80% of the United States' roof surface area. Such asphalt roofing generally reflects some 15% of solar radiation, with the rest of the radiation being absorbed, heating the surface and in turn generating infrared radiation. Rooftop installation of devices incorporating the architecture immediately underneath and adjacent to solar radiation absorbing asphalt roof shingles would enable high efficiency electricity generation at minimal cost. Such TPV devices would avoid the need for mounting panels above the roof, minimizing the potential wind and water damage. Since the mean incident solar radiation, averaged over a year during daylight hours in North America, is approximately 750 W/$m^2$, taking into account an average reflectance of 15% this represents a roof top energy density of approximately 640 W/$m^2$.

In one example, shingle temperatures were measured on a house in Florida over a 24 hour period; the weighted average of the radiant intensity is 522 W/$m^2$. Over this temperature range the maximum of the spectral radiancy curve shifts from 8.7 µm at 333K to 9.9 µm at 294 K. The average roof size of a single family dwelling in the US is 2400 square feet, or ≈250 $m^2$. For an average house in Florida over a 24 h period the TPV device could be expected to generate 24 h·522 W/$m^2$ (24 h average value)·200 $m^2$ (200 out of the 250 $m^2$ roof)·0.1 (10% photon to collected charge conversion efficiency)=251 kWh.

For a given thermal emitter, such as a planar tungsten metal sheet, each side of the sheet emits half of the infrared thermal emissions, with the edge of the tungsten sheet representing a negligible portion of the surface area. From a first principles consideration the flat, planar asphalt shingle can be considered a comparable thermal radiation emitter, that is with half of the thermal radiation directed outwards from the shingle towards the sky and the other half of the thermal radiation directed inwards towards the TPV device underneath the shingle. In which case then the TPV device underneath the asphalt shingles can be expected to generate 125.5 kWh. However, in contact with the shingle, either directly or through air convection, the 1-D integrated charge production architecture TPV device acts as a heat sink, with thermal energy, through thermal convection, passing from the shingle to the TPV device with, in turn, thermal radiation emitted by the nanowires converted to electricity which is transported away from the device, by conductive wires, cooling it. That is, the TPV device will act as a heat sink to the asphalt (or any composition) shingles. The performance of the TPV device as a heat sink is proportional to its radiation-to-electricity conversion efficiency, with higher efficiencies in turn leading the TPV to perform as a superior heat sink, and thus collecting a greater portion of the thermal energy resident in the asphalt shingle. Hence the net output power from the underlying TPV devices is, at a minimum, approximately 125.5 kWh. Assuming 10% of the energy that would otherwise be radiated outward from the shingle, towards the sky, is conveyed to the TPV device through convection due to its heat-sink nature, would increase the power output of the device to approximately 138 kWh; the TPV device converts both thermal radiation and thermal energy into electricity. In comparison, taking into account the day-night diurnal variation, a polycrystalline silicon PV system on the same roof would provide: 750 W/$m^2$·200 $m^2$·7%·12 h operation=126 kWh.

In an alternative application of the invention, rather than being placed under the shingles and operating purely as a TPV device, the 1-D integrated charge production architecture can be effectively utilized when placed above the shingles, in this case operating as a TPV device. Consider as the building block a n-type anatase $TiO_2$ nanowire array film grown upon, and residing upon, a FTO coated glass substrate; an aluminum thin-film substrate is used as a counter electrode in contact, either directly or through an intermediate buffer layer, with the p-type semiconductor. Nanoparticles of p-type InSb are intercalated within the nanowires with a gradient in particle size, and hence energy bandgap, and hence radiation absorbing properties. At the base of the nanowires, near where the wires connect with the FTO layer the nanoparticles are larger, having a lower bandgap energy; in the case of InSb approximately 0.17 eV. The nanoparticles become smaller as they approach the aluminum counter electrode with, in this example, the smallest particles possessing a bandgap energy suitable for absorption of violet (350 nm to 430 nm wavelength) photons. The FTO-glass substrate, upon which the solar radiation is incident, passes ultraviolet, visible and infrared photons into the device; most of the ultraviolet photons are absorbed by the $TiO_2$ nanowires generating electron-hole pairs. Any ultraviolet photons, and visible light photons passing through the FTO coated glass substrate and through the titania nanowire layer, incident upon the low band gap materials, will generate multiple excitons in relative proportion between photon energy and absorber bandgap. Absorbed photons that do not generate multiple excitons will generate single excitons. Radiation that reaches the aluminum back contact will be reflected back through the device resulting in increased radiation absorption. In addition to solar radiation, any ambient (background) thermal radiation that enters the device will be absorbed, with infrared photons captured by the low bandgap layer.

For the TPV device operating atop the roof of an average house in Florida, facing the sky (minimal incident thermal radiation during the night), the baseline 294 K thermal radiation from the surrounding environment provides an energy density of approximately 423 $W/m^2$, corresponding to a generation of 24 h·423 $W/m^2$·200 $m^2$·0.1·0.5=101 kWh. With respect to conversion of solar radiation incident upon the TPV device we calculate: 750 $(W/m^2)$·200 $(m^2)$·18.5% (estimated efficiency taking into account the effect of MEG, and conversion of UV, visible, and infrared radiation made possible by the 1-D integrated charge production architecture)·12 h operation=333 kWh. Hence the overall power generation from the TPV device in the 12 h period the shine is shining is 434 kWh, and at night 101 kWh. If the electricity generated by the TPV device is in excess of that required by the household it can be used as a TPC device with the excess electricity used to fabricate a chemical fuel, such as hydrogen by water electrolysis.

It is noted that rather than making a roof from a supporting layer, such as plywood, with a subsequent covering of shingles to provide a water-proof surface, then subsequent mounting of the TPV device, appropriately packaged, above the roof, the devices can be incorporated within a roof structure, for example a glass-metal bilayer or glass-glass bilayer, such that the device serves as both roof, a protective surface impervious to moisture, and power generating device.

In the United States there are approximately 80,000 $km^2$ of paved asphalt surfaces, including roads and parking lots. Current asphalt road lifetimes are 20 years, which is approximately the target lifetime of a commercial photovoltaic device. Black asphalt absorbs virtually all incident radiation, heating the surface and underlying roadbed and in turn emitting infrared radiation. Although average values vary depending upon location, absorbed solar radiation is re-emitted as infrared radiation at an average value of ≈150 $W/m^2$ over the course of the year, north and south, continuous; considering the 80,000 $km^2$ of paved asphalt surface this represents $12,000 \times 10^9$ Watts (12 TW) of infrared radiation arising from asphalt roadways. It is recognized that the direct-current (DC) power harvested by TPV devices could be converted to alternating current (AC) used, by means of an inductive coupling coil, to recharge the battery of a passing electric vehicle. It is noted that radiation is more continuous, and of greater intensity over the course of the year closer to the equator, with more hot days, which in turn results in more thermal radiation that can be converted into electricity using the architecture. Electricity generated by the TPV devices can be used, for example, to power air conditioning units that are so necessary for comfort in such regional areas.

As an illustrative example consider an asphalt parking lot in Raleigh, N.C. The parking lot is 50 m by 60 m in size, representing ≈3,000 $m^2$ of surface area in which a 1-D integrated charge production architecture TPV device, of 10% radiation conversion efficiency, is embedded. With an average (continuous) infrared emission of 450 $W/m^2$ (peak temperatures from asphalt roadbeds are generally not as great as asphalt shingles) from the asphalt surface over 24 hours, this represents a sustained output power of 3,000 $m^2$·450 $W/m^2$·24 h·0.1·0.5 (half the thermal radiation of a layer emitted towards CPA device, the other half away from the device)=1,620 kWh, a value that will be increased due to the heat-sink nature of the TPV device. In comparison, installation of a PV system above the parking lot, using a supportive super-structure, would be expected to provide an output power of: 3,000 $m^2$·750 $W/m^2$·7%·10 h operation=1,575 kWh. With respect to TPV application to roadways and parking lots, power output will be reduced by the presence of vehicles, cars or trucks, which tend to be good solar reflectors. However, many large surface-area asphalt parking lots are infrequently used, for example the parking lots associated with stadiums.

In an alternative embodiment, it is known that properly supported glass, or other optically transparent materials can be used as the top-surface of a road underneath which photovoltaic devices can be placed, creating so-called 'solar roadways.' Incorporation of the architecture within TPV devices within such a 'solar roadway' would enable solar and LWIR energy harvesting during daylight hours, and LWIR energy harvesting at night. It is recognized that the power harvesting efficiencies from such 'solar-LWIR roadways' would be impacted with geographical location and time of year.

Consider as another example application a TPV street light pole, as commonly used to illuminate city streets, vertically oriented from the ground, immersed in a continuous 24 h thermal radiation field of 459 $W/m^2$ (300 K). Assume the lamppost to be covered with the TPV devices as described above. The lamppost is 0.2 m in diameter and 8.0 m in height for a surface area of 5.0 $m^2$. Ignoring contributions due to reflected light, half of the cylindrical lamppost, 2.5 $m^2$, could be illuminated by sunlight at any given time.

For the lamppost covered with the 1-D integrated charge production architecture TPV device, operating within a continuous background radiation field of 459 $Wm^2$, this will correspond to a generation of 459 $W/m^2$·5.0 $m^2$·0.1=230 W, or 2.8 kWh. With respect to conversion of solar radiation incident upon the TPV street light pole we calculate: 750 $W/m^2$·2.5 $m^2$·18.5% (estimated efficiency taking into account the effect of MEG, and conversion of UV, visible, and infrared radiation made possible by the 1-D integrated charge production architecture)·12 h operation=4.2 kWh. Hence the overall power generation from the TPV covered pole in the 12 h period the shine is shining is 7.0 kWh, and at night 2.8 kWh. During the day the street light pole can supply electricity to the grid, while at night the electricity can power a light bulb to provide illumination.

One application of the described TPV device is providing power to portable electronics, such as smart phones, through the harvesting and conversion of ambient thermal radiation from animals or people to electricity, as well as conversion of incident light to electricity. The skin temperature of a human is generally 36° C., or 309 K, for a radiant intensity of 517 $W/m^2$ with a maximum of the spectral radiancy curve at 9.4 μm. A TPV device placed adjacent to the skin would harvest the associated LWIR radiation emitted by the person converting it to electricity. By the same token, typical room (home, office, car interior, etc.) temperatures are approximately 300

K for a radiant intensity of 459 W/m² with a maximum of the spectral radiancy curve at 9.7 μm. Further, whenever the TPV device was exposed to light, the 1-D integrated charge production architecture would convert the incident visible light, in addition to incident infrared radiation, to electricity.

The thin-film nature of the TPV device facilitates easy integration within the packaging, or framework, of a portable electronic device. As an illustrative example, assume the back of an iPhone 4 (115 mm×59 mm, 67.85 cm²) is covered with the TPV device as described in Example #2: TPV-TPC Gradient Radiation Absorbing Layer. With the iPhone placed within a typical room (home, office, car interior, etc.) environment/temperature, approximately 300 K for a radiant intensity of 459 W/m², the TPV panel will supply the iPhone approximately 46 mW/cm²·67.85 cm²·0.1=0.31 W.

With the same iPhone placed near the skin, or held in the hand, the TPV device is exposed to a thermal radiation field of approximately 517 W/m². Held in the hand, from conversion of LWIR radiation the TPV device would provide approximately 52 mW/cm²·67.85 cm²·0.1=0.35 W.

Radiation incident upon the phone but not converted to electricity will heat the phone, so too will waste-heat due to the electronic processing inherent to the portable electronics. As such the phone, due to its temperature, will emit thermal radiation through the front, back and sides of the portable electronics in proportion to the surface area and emissivity properties of the material. Thermal radiation emitted by the portable electronics in the direction of the TPV device will be converted to electricity; assuming a baseline of 300 K, although higher temperatures are possible depending upon processor operation, the TPV panel will supply the iPhone approximately 46 mW/cm²·67.85 cm²·0.1=0.31 W. Hence for an iPhone, held between a person and the ambient environment, would receive both thermal radiation fields, offering a potential of 0.66 W.

It is a further aspect of the TPV device that conversion of LWIR radiation will reduce the TPV temperature; thus the TPV device will act as a heat-sink to device operation, improving device performance.

Further, thermal energy such as that associated with the processor, or if the portable electronic device is placed on a surface of elevated temperature, would reach the TPV device by thermal convection, and so too this energy would be converted to thermal radiation by the TPV, with thermal radiation emitted largely within the basal plane of the device, and hence converted to electricity.

When TPV device is exposed to direct sunlight we calculate a power generation of: 85 mW/cm²·67.85 cm²·18.5% (estimated efficiency taking into account the effect of MEG, and conversion of UV, visible, and infrared radiation made possible by the 1-D integrated charge production architecture)=1.07 W.

From the above discussion it is seen that the power provided by the TPV device placed within, in this example an iPhone, will vary depending upon whether the iPhone is held in the hand by the user, in a dark but room-temperature environment, placed in a shirt pocket, etc.

It is recognized that a pacemaker, used to regulate heart beats, is in effect a portable electronic device. A pacemaker can be fitted with a TPV device within its housing; conversion of the infrared radiation surrounding the pacemaker would result in generation of electrical power by which the pacemaker can be powered. Pacemakers and other biomedical devices, such as insulin pumps, can be powered by TPV utilization of infrared radiation.

The mechanical efficiency of combustion engines is approximately 25%, with the majority of the fuel energy content emitted, by which it is meant vented or expelled, to the local environment in the form of waste heat. 60% to 62% of the fuel energy content in an internal combustion based vehicle goes into thermal exhaust heat. For each gallon of gasoline, which has an energy content of 121.6 MJ/gallon, the energy dispersed by thermal exhaust heat is approximately 73 MJ; this energy is available for harvesting using the 1-D integrated charge production architecture TPV devices. For a gallon of gasoline consumed by an IC engine over a thirty-minute period, the power corresponding to waste heat is 67.6 kW.

The temperature of gasoline internal combustion (IC) engines is approximately 2300 K, a sufficiently high enough temperature to damage the engine housing. Consequently, combustion engines are coupled with extensive thermal conduction systems, e.g. radiator-based cooling systems, used to transfer this waste heat away from the engine. In this illustrative application, 1-D integrated charge production architecture TPV devices are used to absorb and convert the thermal radiation emitted by the IC engine, in turn cooling the engine while simultaneously generating electricity which can be used to propel the vehicle, or charge it's electrical system instead of an alternator.

The temperature of an exhaust manifold of a gasoline IC engine is approximately 1255 K. Thermal radiation emitted by a 1255 K surface has a spectral radiancy maximum at 2.31 μm, with a radiant intensity of 14.1 W/cm². Catalytic converters typically operate at 589 K, corresponding to a spectral radiancy maximum at 4.92 μm, with a radiant intensity of 0.68 W/cm². The 1-D integrated charge production architecture TPV devices are designed, and specifically fabricated through tailoring of the radiation absorbing semiconductors intercalated within the 1-D nanoarchitecture, to absorb at these peak radiation wavelengths. Such TPV devices can then be applied on a temperature-specific basis to the engine and the engine exhaust system.

In this application the TPV device is made upon a substrate transparent to infrared radiation, for example a CdTe substrate, upon which is a metal, such as stainless steel, layer approximately 200 nm thick, which is sufficiently thick enough to be electrically conductive but thin enough to be radiation transparent. Upon this thin metal layer the 1-D semiconductor nanoarchitecture is grown, as a preferred embodiment an anatase nanowire array. Within the nanowire array a semiconductor material is intercalated, with a composition and, if a nanoparticle, particle size selected to achieve maximum absorption of the specific incident radiation. The back contact of the device is comprised of a metal film, such as aluminum or steel, that will both conduct charge and reflect infrared radiation. Since the emissivity of the metal engine and exhaust system is approximately one, that is the components are excellent emitters of thermal radiation, the TPV devices are placed adjacent to, but just off, the metal surfaces of the combustion engine and associated exhaust system. In this way transmission of energy to the TPV by radiation is maximized, however thermal convection between the metal surfaces and TPV devices will also take place. The CdTe substrate is transparent to infrared radiation, so the thermal emissions from the engine components pass into the device; radiation not absorbed will reach the back contact comprised of metal, raising its temperature. As the metal back contact temperature increases it will emit thermal radiation, half of which will pass back through the device where it will be partially absorbed, creating electricity. Infrared radiation that passes out of the TPV device will return to the engine exhaust system from which it was originally expelled, and from there be re-emitted back into the TPV device.

A typical catalytic converter has a surface area of approximately 510 cm$^2$, while a typical exhaust manifold and engine block have a combined surface area of approximately 4,290 cm$^2$. TPV electricity generation due to conversion of waste thermal radiation associated with IC fuel combustion is then, approximately (510 cm$^2 \cdot$0.68 W/cm$^2$+4,290 cm$^2 \cdot$14.1 W/cm$^2$)=60.8 kW; assuming a TPV device radiation-to-electricity conversion efficiency the output power will be approximately 6.1 kWatt. This electricity, for example, could be used to power an electric motor helping to propel the vehicle. Alternatively, this electricity could be used to replace the alternator of the vehicle, used to charge the battery and power the on-board electronics, resulting in a fuel efficiency increase of some 6% to 8%.

In addition to converting the waste heat from combustion to energy, it is also recognized that 1-D integrated charge production architecture TPV devices can be placed on the exterior of a vehicle, such as a car or truck, to generate additional power. Consider as an example a 1 m$^2$ TPV device integrated into the roof of a vehicle; when exposed to direct sunlight we calculate a power generation of: 100 mW/cm$^2 \cdot$10$^4$ cm$^2 \cdot$18.5% (estimated efficiency taking into account the effect of MEG, and conversion of UV, visible, and infrared radiation made possible by the 1-D integrated charge production architecture)=185 W. Radiation incident upon the vehicle that is neither reflected nor converted to electricity will heat the TPV device, likewise ambient thermal radiation from the environment, and so too will heat escaping, through thermal conduction, the interior of the vehicle. As the TPV device increases in temperature it will emit thermal radiation and, as described previously due to the unique 1-D integrated charge production architecture, this thermal radiation will be converted to electricity. Assuming a baseline of 325 K, although higher temperatures are possible depending upon weather conditions and geographical location, the TPV panel will supply approximately 63.3 mW/cm$^2 \cdot$10$^4$ cm$^2 \cdot$0.1=63 W.

Aluminum is obtained through an energy-intensive electrolytic smelting process; it is estimated that approximately 5% of the U.S. electrical grid consumption goes to aluminum smelting. In the Hall-Heroult process alumina is first dissolved into molten sodium hexafluoroaluminate. Na$_3$AlF$_6$, with calcium fluoride and then electrolytically reduced to aluminum a temperature between 1,225 K and 1,255 K. Reduction line currents for modern smelters are approximately 350,000 A. Dissolved in the molten electrolyte, at the cathode: Al$^{3+}$+3e$^-$→Al. Oxygen is formed at the anode: 2 O$^{2-}$→O$_2$+4 e$^-$. In modern smelters 12.8 kW·h of electricity, or 46.1 MJ, is required for fabrication of 1 kg of aluminum.

A 1240 K reactor emits a radiant intensity of 134 kW/m$^2$, with a maximum of the spectral radiancy curve at 2.34 μm. The exterior surface area of a modern aluminum smelting electrolytic cell, the so-called 'pot,' is approximately 4 m$^2$. Coverage of this surface with a 1-D integrated charge producing architecture TPV device would provide an electrical output of 4 m$^2 \cdot$134 kW/m$^2 \cdot$10% device conversion efficiency=53.6 kW. The linings of aluminum smelter pots typically last five years before replacement is required, which requires the pot be turned off. On an annual basis, with continual pot operation, the TPV devices would provide approximately 470 MW·h of power, sufficient for fabrication of approximately 33,700 kg of aluminum. If desired, TPV devices could be used to cover surfaces interior to the building in which the smelter is housed, all of which is continuously exposed to elevated temperatures. Alternatively, 1-D TPV devices could be placed atop the roof of the building housing the aluminum smelting pots, being able to convert thermal radiation on a 24 h basis and solar radiation when illuminated during daylight hours.

It is recognized that a 1-D integrated charge production architecture TPV panel would provide the user with electricity under solar radiation, and so too infrared thermal radiation. Such a panel, for example, would provide an individual, such as a hiker or camper, in the wilderness, at night, in a cold region, the means for generating electricity by starting a fire. Placing the 1-D TPV device in the presence of a wood fire, for example, would generate electricity that would be available for use by the hiker. Similarly, such 1-D TPV panels could be used to generate electricity that in turn would power a thermoelectric cooling device used to preserve food quality. Such 1-D TPV panels would be useful for emergency and rescue operations, such as on lifeboats, by which both solar radiation and night-time LWIR radiation could be converted to electricity able to power, for example, a continuously operating identifying rescue-beacon.

The present invention teaches application of 1-D integrated charge production architecture TPV-TPC devices in promotion of catalytic reactions.

Cracking refers to a high temperature process by which long-chain hydrocarbons are transformed into short-chain hydrocarbon compounds through breaking of carbon-carbon bonds. Petroleum cracking processes include, for example, the production of chemical feedstocks such as ethylene, diesel, and gasoline components, that is hydrocarbons generally having five to twelve carbons, from 'heavy' or 'crude' oil. Cracking is a high temperature catalytic process, with operational temperatures of approximately 1000 K to 1250 K; specific details on chemical reactions and rate of reactions are dependent upon the temperature and catalyst(s) present. A 1000 K surface with an emissivity of one has a spectral radiancy maximum at 2.90 μm, with a radiant intensity of 5.7 W/cm$^2$. A 1250 K surface with an emissivity of one has a spectral radiancy maximum at 2.32 μm, with a radiant intensity of 13.8 W/cm$^2$.

The high temperatures necessary for cracking result in significant infrared radiation from the metal, commonly stainless steel or nickel, of which the cracking chambers are comprised. Adjacent placement to the cracking chambers of the described 1-D integrated charge production architecture TPV-TPC devices results in electron-hole pair generation. Hydrocarbon exposure to these electron-hole pairs results in free radical generation and breaking of carbon-carbon bonds that in turn promote the catalytic process. Depending upon the desired final hydrocarbon output, the infrared generated electron-hole pairs are used to promote catalytic conversion of the heavy hydrocarbons to light hydrocarbons. It is known that a large number, typically several hundred, of chemical reactions occur during cracking the majority of which are based upon free radicals.

In this application the infrared TPV-TPC generated electrons and holes can be used directly to promote catalytic conversion either by passing a hydrocarbon fluid over and/or through the surface of the 1-D integrated charge producing architecture, in a manner akin to a fluidized bed reactor. Alternatively, the holes and electrons can be separately collected at an electrically conductive surface to promote two separate chemical reactions, one being promoted by electron donation and the other by electron acceptance, such as for example water electrolysis where electrons are required for oxygen evolution and holes (the absence of an electron) are required for hydrogen evolution. Alternatively, the electrons and holes can be separately collected to form an electrical potential, and thereby electricity, with the electricity used to facilitate the cracking process, such as for example powering an electric heater or electronic temperature regulation device.

The carbon atoms in hydrocarbon fuels, for example gasoline or diesel, serve to stabilize the fuel allowing for it to be readily and safely transported as a liquid. While carbon atoms promote hydrocarbon stability, energy content is determined from the hydrogen atoms. For example, 1 kg of liquid hydrogen has an energy content of 141.9 MJ, while 1 kg of gasoline has an energy content of approximately 42.7 MJ. However, without the stabilizing effect of carbon atoms hydrogen is a gas at room temperature, making storage and dispensing difficult. Hydrocarbon combustion requires breaking of the hydrogen-carbon bonds; one of the inefficiencies inherent to a combustion engine is that part of the fuel energy content goes into C—H bond breaking rather than piston displacement; the formula for stoichiometric burning of a hydrocarbon fuel is:

$$C_xH_y + \left(x + \frac{y}{4}\right)O_2 \rightarrow xCO_2 + \left(\frac{y}{2}\right)H_2O$$

Since the mechanical efficiency of combustion engines is approximately 25%, the majority of the hydrocarbon fuel content is emitted in the form of waste heat. In TPC application to combustion engines, infrared photons emitted by the engine structure are absorbed by the low bandgap infrared responsive semiconductors with, in turn, generation of electron-hole pairs. The electron-hole pairs are separated at the interface between the infrared radiation absorbing semiconductor and the charge transporting crystalline 1-D metal oxide structures, which in turn results in the charge carriers being available for chemical reactions.

In this application the hydrocarbon fuel, prior to combustion, is pre-treated by the TPV-TPC generated electrons and holes. Traveling from the storage tank to engine for combustion, the hydrocarbon fuel is passed over and/or through the 1-D TPC materials; the ready availability of electrons and holes result in free radical formation that in turn facilitates separation of the carbon-hydrogen bonds. This fuel, when combusted in the engine, generates more mechanical force since a greater portion of the energy content of the fuel goes into piston displacement rather than breaking carbon-hydrogen bonds.

Alternatively, the electrons and holes from the TPV-TPC system can be collected at physically separate electrodes for the promotion of two separate chemical processes. For example, while the infrared generated holes may be used to promote free radical generation in the hydrocarbon stream, or fuel line, of the engine, the electrons may be made available to the air stream for oxidation reactions to promote a cleaner burning fuel. As another illustrative example, the separated electrons and holes can be used to generate hydrogen and oxygen through water electrolysis, with the generated hydrogen then passed to the fuel line of the combustion engine to promote more energy intense combustion, and the oxygen passed to the air intake of the IC engine to promote cleaner combustion due to a reduction of nitrogen and subsequent NOx formation.

TPV-TPC conversion of thermal radiation to electrons and holes enables conversion of combustion exhaust gases, primarily $CO_2$ and $H_2O$ vapor, into hydrocarbons that can be used as fuel. Thermal radiation sources can be utilized on a small scale, such as the thermal waste heat generated by a single IC engine, or on a large scale such as a geothermal reservoir. For example, a geothermal well lined with TPV-TPC devices incorporating the architecture could be used to providing power or to catalyze the formation of methane from a hydrogen source and $CO_2$ (or CO).

As a further example, $CO_2$ and $H_2O$ can be converted to methane through the addition of electrons and holes:

$$CO_2 + 2e^- + 2h^+ \rightarrow CO + \frac{1}{2}O_2$$

This oxidation-reduction reaction is dependent upon the catalysts present, but it understood to occur in several elementary steps, for example:

$$CO_2 + H^+ + e^- \rightarrow .HCO_{2(ads)}$$

$$.HCO_{2(ads)} + H^+ + e^- \rightarrow CO + H_2O$$

$$2H_2O + 2h^+ \rightarrow 2.OH_{(ads)} + 2H^+$$

$$2.OH_{(ads)} \rightarrow \frac{1}{2}O_2 + H_2O$$

The CO formed in this way would react with atomic hydrogen to form a hydrocarbon, for example:

$$H_2O + h^+ \rightarrow OH^- + H^+$$

$$2CO_2 + 4e^- + 4h^+ \rightarrow 2CO + O_2$$

$$CO + 6e^- + 6H^+ \rightarrow CH_4 + H_2O$$

In this case, the free energy for overall methane formation:

$$CO_2 + 2H_2O(g) \rightarrow \square CH_4 + 2O_2$$

is about 801 kJ/mol, a process requiring 8 electrons.

As desired, and known to those in the field, select catalysts can be used to minimize or entirely prevent back reactions and, importantly, determine the specific hydrocarbon formed. With respect to use in IC engine powered vehicles exhaust gas recirculation (EGR), that is conversion of the combustion engine exhaust gas to a hydrocarbon, enables enhanced fuel efficiencies. On a larger scale such as that indicated by utilization of geothermal resources, such plants would be suitable for conversion of the waste combustion gases generated by, for example, a coal burning power plant. The TPV-TPC generated hydrocarbons, reclaimed from conversion of combustion exhaust gases, can be stored or fed directly into a combustion chamber as desired.

The Fischer-Tropsch process describes hydrocarbon formation from hydrogen and carbon monoxide; for alkane formation we have:

$$(2n+1)H_2 + nCO \rightarrow C_nH_{(2n+2)} + nH_2O$$

where 'n' is a positive integer. In addition to alkane formation, competing reactions give small amounts of alcohols, alkenes, and oxygenated hydrocarbons.

The conversion of CO to alkanes involves the hydrogenolysis (cleavage with $H_2$) of C—O bonds, and the formation of C—C bonds. In particular, reactions that form C—C bonds are critical to the production of liquid fuels. The Fischer-Tropsch process is generally operated with a temperature range of 425 K to 575 K. Higher temperatures lead to faster reactions and higher conversion rates but also tend to favor methane production, hence lower temperatures are commonly used. A variety of synthesis-gas compositions can be utilized depending upon the catalyst used and reaction temperature; for cobalt-based catalysts the optimal $H_2$:CO ratio is approximately 2. The most common catalysts used in the Fischer-Tropsch process are transition metals such as cobalt, iron, and ruthenium. In addition to the active metal the catalysts typically contain a number of co-catalysts such as copper and potassium. Catalysts are supported on high-surface-area binders/supports such as silica, alumina, or zeolites.

Cobalt catalysts are more active for Fischer-Tropsch synthesis when the feedstock has a high hydrogen to carbon ratio.

The product distribution of hydrocarbons formed during the Fischer-Tropsch process follows an Anderson-Schulz-Flory (ASF) distribution, expressed as:

$$W_n = n(1-\alpha)^2 \alpha^{n-1}$$

Where $W_n$ is the weight fraction of hydrocarbon molecules containing n carbon atoms, and $\alpha$ is the chain growth probability—largely determined by the catalyst and details of the specific process. The ASF equation demonstrates that methane will be the largest single product so long as $\alpha$ is less than 0.5; however, by increasing $\alpha$ close to one, the total amount of methane formed can be minimized compared to the sum of all of the various long-chained products.

Typical liquid hydrocarbon fuels, such as gasoline or diesel fuel, contain approximately 13-15% hydrogen by mass. As an example, consider the synthesis of (liquid) octane, $C_8H_{18}$, as a representative liquid fuel hydrocarbon fabricated from a hydrogen-CO gas mixture, available from the exhaust of a combustion engine, using a Fischer-Tropsch catalyst:

$$16CO(g) + 34H_2(g) \rightarrow 2C_8H_{18}(g) + 16H_2O(g)$$

In this application the electron-holes made available through the TPV-TPC devices are used for electrolysis of water vapor present in the combustion exhaust, with the hydrogen then combined with the CO that is present within the exhaust and also obtained, as needed, from reduction of the exhaust $CO_2$ for fuel formation.

With respect to on-vehicle use, suitable operating temperatures as needed for the Fischer-Tropsch process, $\approx$425 K to 475 K, are maintained by placing the TPV-TPC devices adjacent to the engine block, exhaust manifold, or in the case of automobiles catalytic converters, where the Fischer-Tropsch reaction chamber is heated by thermal convection, with needed electrical charges provided by the 1-D TPV-TPC devices.

The described 1-D integrated charge production architecture TPV-TPC devices provide charge, electrons and holes, able to drive chemical conversions by which energy can be stored. As previously described, the TPV-TPC devices are able to respond to ultraviolet, visible, and infrared radiation generating electron-hole pairs. Further, said devices are able to convert thermal energy, associated with the device temperature and its generation of LWIR radiation, directly to electricity.

One example application of the TPV-TPC technology is use of the collected electrons and holes for water electrolysis generating hydrogen and oxygen. Collecting the electrons and holes at separate electrodes, typically made of platinum or stainless steel, allows for water electrolysis with the generation of oxygen and hydrogen. At the anode the holes oxidize water generating oxygen gas, while at the cathode electrons reduce the hydrogen ion generating hydrogen gas.

$2H^+(aqueous) + 2e^- \rightarrow H_2(gas)$    Cathode reaction:

$2H_2O(liquid) \rightarrow O_2(gas) + 4H^+(aqueous) + 4e^-$    Anode reaction:

$2H_2O(liquid) \rightarrow 2H_2(gas) + O_2(gas)$    Overall reaction:

Consider, as an illustrative benchmark value, the TPV device described in the example above for internal combustion engines, with generation of 6.1 kW of electricity due to conversion of thermal radiation, from unwanted waste heat associated with IC fuel combustion. Assuming a standard electrolysis electrical-to-chemical energy efficiency of 90%, 6.1 kW over a 1 h period will result in hydrogen generation having an energy content of approximately 6100 J/s·0.9·3600 s=19.8 MJ. On an energy equivalent basis, 19.8 MJ is roughly the energy content of 0.5 kg of gasoline.

As another example, it is recognized that 1-D integrated charge production architecture TPV-TPC devices can be used as hydrogen-fuel generators. Consider as an example the 1-D integrated charge production architecture TPV device operating atop the roof of an average house in Florida, the baseline 300 K thermal radiation from the surrounding environment provides an energy density of approximately 459 W/m², corresponding to a generation of 24 h·459 W/m²·200 m²·0.1·0.5=110 kWh. With respect to conversion of solar radiation incident upon the TPV device we calculate: 750 (W/m²)·200 (m²)·18.5% (estimated efficiency taking into account the effect of MEG, and conversion of UV, visible, and infrared radiation made possible by the 1-D integrated charge production architecture)·12 h operation=333 kWh. Hence the overall power generation from the TPV device in the 12 h period the shine is shining is 443 kWh, and at night 110 kWh. This power is used to generate hydrogen fuel through electrolysis; assuming a standard electrolysis electrical-to-chemical energy efficiency of 90%, during a night/day 24 h period hydrogen having an energy content of approximately 443,000 (J·h/s)·3600 (s/h)·0.9+110,000·3600·0.9=1.79 GJ, which is roughly the energy equivalent of 14.7 gallons of gasoline.

The 1-D integrated charge production architecture TPV-TPC device can be coupled with a molecular catalyst that has the ability to drive or catalyze non-spontaneous chemical reactions. Both the 1-D semiconductor, into which the LWIR radiation absorbing material is intercalated, and/or the LWIR responsive semiconductor itself, can be coupled with molecular oxidation or reduction catalysts for promotion of a chemical reaction. The 1-D integrated charge production architecture TPV-TPC device activates the molecular catalyst, for example a ruthenium poly-pyridine complex, allowing it to drive a chemical reaction through the transfer of an electron or hole. In a preferred, but not limiting embodiment, the 1-D TPV-TPC structure is single crystal anatase nanowires into which low bandgap infrared absorbing quantum dots are intercalated. Electron-hole pair generation activates a molecular catalyst driving a chemical reaction.

There are several complementary ways by which the described 1-D TPV-TPC materials can be utilized to reduce NOx emissions from an internal combustion engine. Radiation can be used by a 1-D TPV device to generate electron-hole pairs suitable for water electrolysis, creating oxygen and hydrogen, with the evolved hydrogen fed into the engine fuel line, and the evolved oxygen fed into the engine air line. The addition of pure oxygen into the air intake of an engine would, since air is approximately 80% nitrogen, reduce the nitrogen content in the combustion chamber and hence reduce the amount of NOx emitted in the exhaust gas. Also, as detailed in the above example, in TPC application the semiconductors comprising the TPC device can be coupled with a molecular catalyst designed for oxidation or reduction of a specific pollutant, in this case NOx. In this specific application, the 1-D integrated charge production architecture TPC device, coupled with a molecular catalyst such as vanadium or niobium, is placed within the exhaust pipe, with the photon-generated electrons and holes not transported away from the device but rather made available to the surrounding gas for oxidative and reductive chemistry.

The process of dehydration, elimination of a water molecule, is used to convert an alcohol into an alkane by the process of dehydration. Dehydration requires an acid and the application of heat to convert the alcohol into a protonated alcohol, which can then undergo heterolysis to lose the weakly basic water molecule. For dehydration of secondary and tertiary alcohols, generally a fast acid-base reaction between the alcohol and the acid catalyst is required which yields a protonated alcohol and the conjugate base of the acid. Subsequently, the protonated alcohol undergoes heterolysis in to form a carbon-cation and water. The carbon-cation then loses a proton to the base to yield the alkene.

Conversion of ethanol to alkanes is achievable by aqueous-phase reforming. In a process involving no additional additives, ethanol is first dehydrated through the interaction with solid acid catalysts such as silica-alumina, or by co-feeding the ethanol with a mineral acid such as HCl. The dehydrated ethanol is then hydrogenated on a metal catalyst, such as platinum or palladium. Proper balance of inputs leads to a product output of alkanes, $CO_2$ and water. Alternatively, co-feeding hydrogen with ethanol allows ethanol conversion to alkanes and water without the formation of $CO_2$ since hydrogen does not need to be produced by an intermediate reaction. Alkane selectivity can be controlled through choice of metal catalyst, which in turn controls the relative rates of C—C bond breaking versus hydrogenation. Pd—SiAl catalysts, for example, exhibit high selectivity for alkane production, in particular hexane, versus $CO_2$ when hydrogen is co-fed with ethanol into the reactor, since the rate of C—C bond breaking on Pd is slower than the hydrogenation reactions on Pd sites. As illustrated, the ability of the radiation harvesting 1-D TPV-TPC materials to provide hydrogen, through for example water electrolysis, to the reaction enables cost effective conversion of ethanol to alkanes with only minimal associated $CO_2$ emissions.

As described, LWIR photons can be used by the 1-D TPV-TPC system for generation of hydrogen and oxygen through water electrolysis. Combustion of hydrogen with oxygen results in water. The result is a means for storing infrared thermal radiation and without associated pollutants. Similarly, the electrons-holes of the 1-D TPV-TPC materials can be used to drive solid state or liquid chemical reactions for charge storage.

The invention can be further illustrated by the following examples thereof, although it will be understood that these examples are included merely for purposes of illustration and are not intended to limit the scope of the invention unless otherwise specifically indicated. All percentages, ratios, and parts herein, in the Specification, Examples, and Claims, are by weight and are approximations unless otherwise stated.

$TiO_2$ Thick Film Deposition on TCO-Coated Glass

Example 1

A $TiO_2$ solution can be made using 0.1 g to 0.4 g of P25 nanoparticles in 10 ml of solvent which can be, for example, 3 ml titanium tert-butoxide in 7 ml ethanol. Solution dispersion is enhanced by stirring for an extended period, approximately 5-20 min. A FTO-glass substrate, was immersed in the $TiO_2$ solution between 30 seconds and 180 minutes, and more preferably between 3 min and 60 min. After deposition of the several micron thick $TiO_2$ film, the substrate was taken out from the solution and annealed at 500° C. for 1 h to remove any residual organics. After this step, a protective Teflon coating was sprayed onto the back (non-TCO covered side) of the glass substrate.

It is to be understood that the above-described embodiments are illustrative of only a few of the many possible specific embodiments, which can represent applications of the principles of the invention. Numerous and varied other arrangements can be readily devised in accordance with these principles by those skilled in the art without departing from the spirit and scope of the invention.

What is claimed is:

1. A method of growing crystalline anatase nanowires upon a substrate comprising the steps of:
   deposition of titania onto a clean substrate;
   conversion of the titania into titanate nanowires; and,
   treatment of the titanate nanowires to produce crystalline anatase nanowires.

2. The method of claim 1 wherein the clean substrate is obtained by the steps of: placing a substrate into an ultrasonic bath of isopropanol, followed by placing the substrate in ultrasonic bath of acetone, followed by placing the substrate in an ultrasonic bath of methanol, followed by placing the substrate in an ultrasonic bath of water; and drying the substrate with an inert gas.

3. The method of claim 1 wherein the clean substrate is obtained by the steps of: sonicating the substrate in a NaOH saturated ethanol solution, rinsing the substrate with de-ionized water; and drying the substrate with an inert gas.

4. The method of claim 1 in which one or more solvents are used, either simultaneously or sequentially.

5. The method of claim 4 in which the solvent is comprised at least in part of one or more hydroxides, which are be selected from the group consisting of NaOH, KOH, LiOH, RbOH, $Ca(OH)_2$ and $NH_4OH$, to produce a nanowire composition containing the alkali ion of the hydroxide used.

6. The method of claim 5 wherein the solvent molarity is in the range of about 0.5 M to about 18 M.

7. The method of claim 1 wherein the treatment step includes immersion of the titanate nanowires in an acid solution.

8. The method of claim 7 wherein the acid solution is of the molarity range of about 0.01 M to about 5 M.

9. The method of claim 1 wherein the treatment step includes annealing of the titanate nanowires.

10. The method of claim 9 wherein the annealing step is completed in the presence of gas.

11. The method of claim 10 wherein the gas utilized in the annealing step is comprised at least in part of oxygen.

12. The method of claim 1 wherein the substrate is comprised of one or more types of glass, metal, ceramic, fiber, and/or polymer.

13. The method of claim 1 in which the crystalline anatase nanowires are grown upon one or both sides of the substrate, the substrate being flat.

14. The method of claim 1 in which the crystalline anatase nanowires are grown upon one or more sides of the substrate, where the substrate is a three dimensional structure, the structure constructed in the form of a cylinder, sphere, polyhedron, honeycomb, lattice, or other structures with regular or irregular dimensions.

15. The method of claim 1 wherein the substrate is comprised of or coated with graphene, or other material comprised at least in part of carbon.

16. The method of claim 1 wherein the substrate is coated on one or more sides with a transparent conductive oxide ("TCO") layer.

17. The method of claim 16 in which the TCO layer is comprised of one or more oxides, which are selected from the group consisting of tin oxide ("$SnO_2$"), indium-doped tin oxide ("ITO"), and fluorine-doped tin oxide ("FTO").

18. The method of claim 1 wherein the substrate is modified for chemical and/or physical resistance.

19. The method of claim 1 wherein the substrate is coated on at least one side with a protective layer, which protective layer may be comprised of Polytetrafluoroethylene ("PTFE"), poly (methyl methacrylate) ("PMMA") dissolved in acetone, photoresist, a layer of sputtered metal or metals, a sacrificial layer of spin-on glass, or other like protective layer.

20. The method of claim 1 in which one or more of the deposition, conversion and/or treatment steps includes the intercalation of quantum dots, of one or more sizes, and of one or more compositions, with or without the use of one or more dyes or other material for absorption of radiation, to sensitize the final anatase nanowire array for absorption of radiation.

21. The method of claim 1 in which one or more of the deposition, conversion and/or treatment steps includes the intercalation of one or more p-type semiconductors within the nanowire arrays, the nanowire arrays being n-type semiconducting anatase.

22. The method of claim 1 in which any of the deposition, conversion and/or treatment steps, or any aspect of such steps, are completed in one or more steps, in any sequence, at the same time as and/or together with one or more other steps, in a continuous or batch manner, and/or multiple times to iteratively produce the desired final crystalline anatase nanowire array.

\* \* \* \* \*